US012658246B2

(12) United States Patent
Augustine et al.

(10) Patent No.: US 12,658,246 B2
(45) Date of Patent: Jun. 16, 2026

(54) THREE-TRANSISTOR EMBEDDED DYNAMIC RANDOM ACCESS MEMORY GAIN CELL IN COMPLEMENTARY FIELD EFFECT TRANSISTOR PROCESS

(71) Applicant: Intel Corporation, Santa Clara, CA (US)

(72) Inventors: Charles Augustine, Portland, OR (US); Seenivasan Subramaniam, Hillsboro, OR (US); Patrick Morrow, Portland, OR (US); Muhammad M. Khellah, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/985,753

(22) Filed: Nov. 11, 2022

(65) Prior Publication Data

US 2024/0161817 A1 May 16, 2024

(51) Int. Cl.
| | |
|---|---|
| *G11C 11/412* | (2006.01) |
| *G11C 11/419* | (2006.01) |
| *H10B 10/00* | (2023.01) |

(52) U.S. Cl.
CPC .......... *G11C 11/412* (2013.01); *G11C 11/419* (2013.01); *H10B 10/12* (2023.02)

(58) Field of Classification Search
CPC . G11C 11/412; G11C 11/417; H01L 27/1104; H01L 27/0207; H01L 29/785; H01L 23/5286
USPC .................................................. 365/154, 205
See application file for complete search history.

(56) References Cited

U.S. PATENT DOCUMENTS

| | | | | |
|---|---|---|---|---|
| 6,317,365 B1 * | 11/2001 | Tanaka | .................. | G11C 11/405 365/189.04 |
| 7,569,894 B2 * | 8/2009 | Suzuki | .................. | H10D 89/10 257/370 |
| 7,961,547 B2 * | 6/2011 | Kanari | .................. | G11C 11/412 365/189.04 |
| 9,419,003 B1 * | 8/2016 | Colinge | .............. | H10D 64/252 |
| 10,312,229 B2 * | 6/2019 | Moroz | ................. | H10D 62/122 |

(Continued)

OTHER PUBLICATIONS

Nassif et al., "Sapphire Rapids: The Next-Generation Intel Xeon Scalable Processor", IEEE International Solid-State Circuits Conference (ISSCC), Feb. 21, 2022, 3 pages.

(Continued)

*Primary Examiner* — Michael T Tran
(74) *Attorney, Agent, or Firm* — Schwabe, Williamson & Wyatt, P.C.

(57) ABSTRACT

Embodiments herein relate to a three-transistor gain cell which is provided using a complementary field-effect transistor device to achieve scaling. The cell includes an n-type layer arranged above a p-type layer. In one implementation, two nMOS transistors are arranged above one pMOS transistor and a conductive path is provided to connect the gate of one of the nMOS transistors to a storage node in the p-type layer, where the storage node is coupled to a drain of the pMOS transistor. In another implementation, one nMOS transistor is arranged above two pMOS transistors and a conductive path is provided to connect the gate of one of the pMOS transistors to a storage node in the n-type layer, where the storage node is coupled to a source of the nMOS transistor.

23 Claims, 18 Drawing Sheets

(56) References Cited

U.S. PATENT DOCUMENTS

| | | | | |
|---|---|---|---|---|
| 10,763,267 | B2 * | 9/2020 | Chong | H10D 89/10 |
| 11,423,204 | B1 * | 8/2022 | Chen | G06F 30/394 |
| 2006/0261417 | A1 * | 11/2006 | Suzuki | H10D 84/907 |
| | | | | 257/370 |
| 2009/0161410 | A1 * | 6/2009 | Houston | G11C 11/412 |
| | | | | 365/189.14 |
| 2014/0131810 | A1 * | 5/2014 | Masuoka | H10D 84/016 |
| | | | | 257/369 |
| 2018/0061766 | A1 * | 3/2018 | Goktepeli | H01L 23/66 |
| 2019/0027535 | A1 * | 1/2019 | Kumar | H10B 61/00 |
| 2020/0066584 | A1 * | 2/2020 | Kao | H01L 21/76898 |
| 2020/0411078 | A1 * | 12/2020 | Sharma | H10B 12/315 |
| 2021/0098500 | A1 * | 4/2021 | Wang | H10D 88/00 |
| 2022/0102266 | A1 * | 3/2022 | Lim | H10D 84/0167 |
| 2022/0122993 | A1 * | 4/2022 | Chiu | H10D 89/10 |
| 2022/0223514 | A1 * | 7/2022 | Sisodia | H01L 23/5226 |
| 2022/0328399 | A1 * | 10/2022 | Preston | H01L 23/481 |
| 2022/0352179 | A1 * | 11/2022 | Yang | H10B 10/12 |
| 2022/0375779 | A1 * | 11/2022 | Or-Bach | H10D 64/027 |
| 2023/0284427 | A1 | 9/2023 | Augustine et al. | |

OTHER PUBLICATIONS

Rao et al., "Power10™: A 16-Core SMT8 Server Processor With 2TB/s Off-Chip Bandwidth in 7nm Technology", IEEE International Solid-State Circuits Conference (ISSCC), Feb. 21, 2022, 3 pages.
Giterman et al., "A 1-Mbit Fully Logic-Compatible 3T Gain-Cell Embedded DRAM in 16-nm FinFET", IEEE Solid-State Circuit Letters, vol. 3, 2020, 4 pages.
Toshiro Hiramoto, "Five Nanometre CMOS Technology", Nature Electronics, vol. 2, Dec. 6, 2019, 2 pages.
Ryckaert et al., "The Complementary FET (CFET) for CMOS scaling beyond N3", Symposium on VLSI Technology Digest of Technical Papers, 2018, 2 pages.

* cited by examiner

| Operation | WBL | WWL | | RBL | | RWL | |
|---|---|---|---|---|---|---|---|
| | | Cir. 1 | Cir. 2 | Cir. 1 | Cir. 2 | Cir. 1 | Cir. 2 |
| Write 0 | 0 | 0 | Vdd | Vdd | 0 | 0 | Vdd |
| Write 1 | Vdd | 0 | Vdd | Vdd | 0 | 0 | Vdd |
| Read 1 | Vdd | Vdd | 0 | 0 | 0 | Vdd | 0 |
| Read 0 | Vdd | Vdd | 0 | Vdd | Vdd | Vdd | 0 |
| Retention | Vdd | Vdd | 0 | Vdd | 0 | 0 | Vdd |

Fig. 10

THREE-TRANSISTOR EMBEDDED DYNAMIC RANDOM ACCESS MEMORY GAIN CELL IN COMPLEMENTARY FIELD EFFECT TRANSISTOR PROCESS

FIELD

The present application generally relates to the field of memory devices and more particularly, to a Dynamic Random Access Memory (DRAM).

BACKGROUND

Memory devices include both volatile and non-volatile memory. The demand for memories has been increasing as larger on-die caches are employed such as in high-performance processors. Static Random Access Memory (SRAM) is a default candidate for supporting these workloads and providing on-chip high density memory. However, SRAM faces scalability issues. DRAM has also been considered to provide a more efficient alternative to SRAM.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 10 depicts an example table of control signals for read, wrote and retention operations for the 3TGC of FIG. 4 or 7, in accordance with various embodiments.

DETAILED DESCRIPTION

Figure 1B:
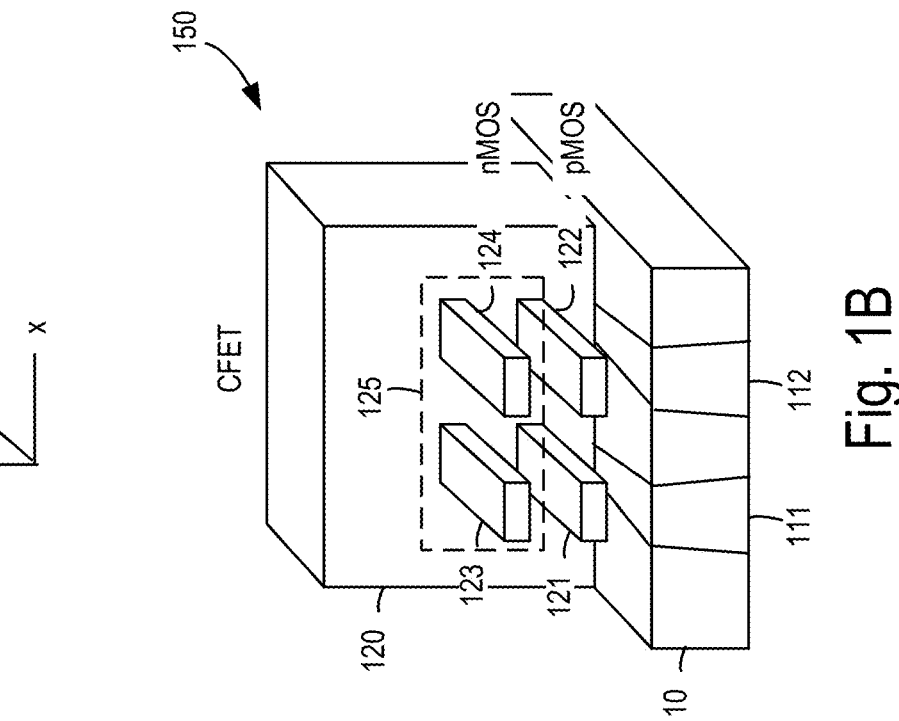
FIG. 1B depicts a perspective view of a complementary field-effect transistor (CFET) in accordance with various embodiments.

As mentioned at the outset, various challenges are presented in scaling memory devices.

Embedded high-capacity memories continue to occupy significant portions of the silicon area. While six-transistor (6T) SRAM remains the default choice for building large on-chip memory arrays due to its high density and high speed, its area scaling has significantly slowed down in the last few process generations (see FIG. 1A), making it incapable of meeting mounting capacity demands driven by data-centric workloads. Embedded DRAM on three-transistor (3T) Gain Cell (3TGC) can enable a more area efficient alternative to 6T SRAM due to its ~2× smaller cell area. 3D Complementary FET (CFET) may also be used to enable hyper area scaling where p-type and n-type metal-oxide semiconductor transistors (pMOS and nMOS, respectively) are vertically integrated in the same footprint, thereby achieving up to 50% area scaling for a typical complementary metal-oxide-semiconductor (CMOS) logic gate (see FIG. 1B). On the other hand, a 3TGC designed with all nMOS transistors or all pMOS transistors cannot fully benefit from CFET technology, resulting in no area scaling versus fin field-effect transistor (FinFET)/planner CMOS processes.

A semiconductor apparatus disclosed herein addresses the above and other issues. In one aspect, CFET friendly 3TGC design is provided with a mix of nMOS and pMOS transistors to efficiently exploit CFET technology, providing the expected 50% cell area scaling.

The semiconductor apparatus exploits 3D CFET processes to build an area-efficient 3TGC. The apparatus used a Design Technology Co-Optimization to obtain a scaling benefit which is not available in previous 3TGC designs.

An efficient 3TGC implementation is provided which enables 50% area scaling in CFET due to using mixed devices to fully exploit the CFET process, and using a dummy gate or node (made of polysilicon) to enable an internal cell connection which at the same time adds extra (free) capacitance on the cell's storage node, thus improving the cell's retention time. One example implementation uses a pMOS write port with an nMOS read port comprising two nMOS transistors. Another example implementation uses an nMOS write port with a pMOS read port comprising two pMOS transistors. The benefits of 50% area scaling and added gate capacitance at the storage node can be achieved with both implementations.

A number of advantages are provided. For example, 3TGC based memories built using CFET can be used in any System on a Chip (SoC) where density, performance, and power consumption are bottlenecks. The 3TGC implementations described herein alleviate challenges associated with 3TGC scaling in CFET along with providing a higher noise margin without requiring a special capacitor process adder.

In one implementation, first and second nMOS transistors are provided in a front side (upper level) of a semiconductor apparatus, and one pMOS transistor is provided in a back side (lower level) of the semiconductor apparatus. The back side also includes a storage node coupled to a drain of the pMOS transistor. A conductive path extends from a control gate of the second nMOS transistor in the front side to the storage node in the back side. In one approach, the conductive path extends laterally of an n-type region of the front side, from the control gate of the second nMOS transistor, up one via to a metal layer and down another via to the storage node. In another approach, the conductive path extends in a via directly to a dummy polysilicon layer in the back side to the control gate of the second nMOS transistor, within the footprint of the p-type region, where the dummy polysilicon layer is coupled to the storage node.

In another implementation, first and second pMOS transistors are provided in a back side of a semiconductor apparatus, and one nMOS transistor is provided in the front side. The front side also includes a storage node coupled to a source of the nMOS transistor. A conductive path extends from a control gate of the second pMOS transistor in the back side to the storage node in the front side. In one approach, the conductive path extends laterally of a n-type region of the front side, from the storage node, up one via to a metal layer and down another via to the control gate of the second pMOS transistor. In another approach, the conductive path extends in a via directly below a dummy polysilicon layer in the front side to the control gate of the second pMOS transistor, within the footprint of the n-type region, where the dummy polysilicon layer is coupled to the storage node.

These and other features will be apparent in view of the following discussion.

FIG. TA depicts plots of normalized density versus technology node for logic density (plot 100) and SRAM cell density (plot 101) in accordance with various embodiments. Logic density continues to increase in proportion to the technology node, which represents an increasingly smaller dimension along the horizontal axis. However, SRAM cell density has increased at a lower rate, resulting in a disparity between logic and SRAM scaling across technology generations. The designs provided herein address this issue by improving a DRAM cell with increased density.

Figure 1A:
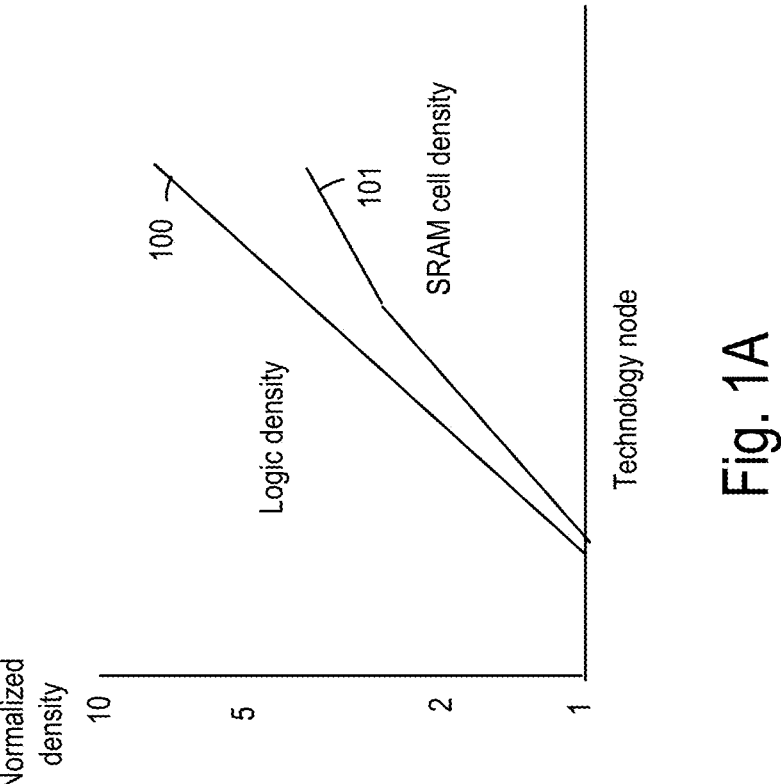
FIG. 1A depicts plots of normalized density versus technology node for logic density (plot 100) and SRAM cell density (plot 101) in accordance with various embodiments.

FIG. 1B depicts a perspective view of a complementary field-effect transistor (CFET) device 150 in accordance with various embodiments. CFET technology provides vertical integration of pMOS and nNMOS transistors. In this example, a substrate region 110 include metal lines 111 and 112. An elevated region 120 includes pMOS (e.g., p-type) diffusion regions 121 and 122 and nMOS (e.g., n-type) diffusion regions 123 and 124 which are vertically above, in the z direction, the p-type regions 121 and 122, respectively. The n-type regions may overlay, and have an overlapping footprint with, the p-type regions. The substrate extends in an x-y plane. The n-type regions can be omitted to provide a region 125 which can be used for interconnects.

Figure 2A:
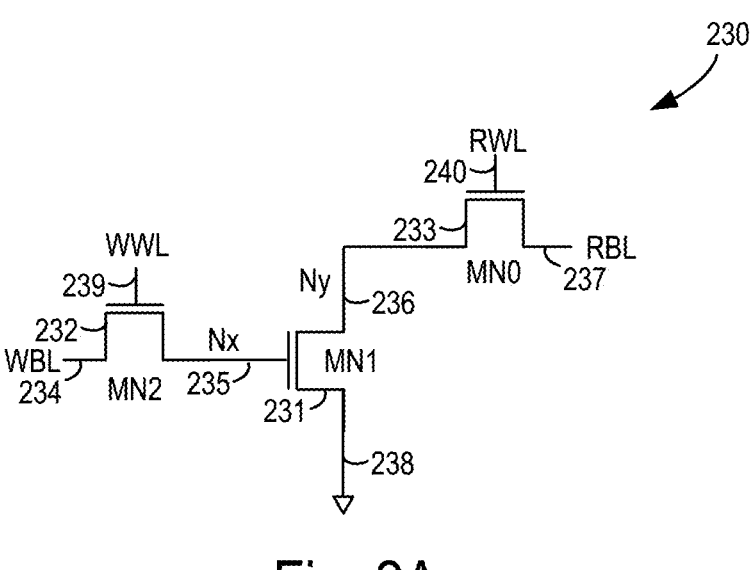
FIG. 2A depicts an example circuit diagram of a comparative three-transistor gain cell (3TGC) with three nMOS transistors, in accordance with various embodiments.

FIG. 2A depicts an example circuit diagram of a comparative three-transistor gain cell (3TGC) with three nMOS transistors, in accordance with various embodiments. All transistors are nMOS transistors in this design. In this case, the layout height is restricted to 92 nm, for example, using an example CFET process, which is the same as a 6T SRAM cell height. Most of the area is devoted to nMOS diffusion and front side metal layer 0 (M0) connectivity, whereas back side or bottom M0 (BM0) and pMOS diffusion area are underutilized. M0 refers to metal zero layer, denoting a first metal layer. See also FIG. 11A. The gain cell is provided using CFET technology.

The memory cell 230 includes first, second and third nMOS transistors 233, 231 and 232, respectively, also referred to as MN0, MN1 and MN2, respectively. MN0 and MN1 are used for reading, where MN0 receives a read word line (RWL) voltage at its control gate 240 and a read bit line (RBL) voltage at its drain 237. A source of MN0 is a voltage Ny on a node 236. This is also a drain voltage of MN1. A voltage of a source 238 of MN1 is at ground (0 V). A control gate 235 of MN1 is a storage node Nx which stores a voltage representing a 0 or 1 bit, for example. MN2 is used for writing to the storage node and receives a write word line (WWL) voltage at its control gate 239 and a write bit line (WBL) voltage at its drain 234. The source of MN2 is at the node Nx. During a write operation of the memory cell, a voltage is set at Nx by controlling MN2. During a read operation of the memory cell, the voltage at Nx is read by controlling MN1 and MN0.

Figure 2B:
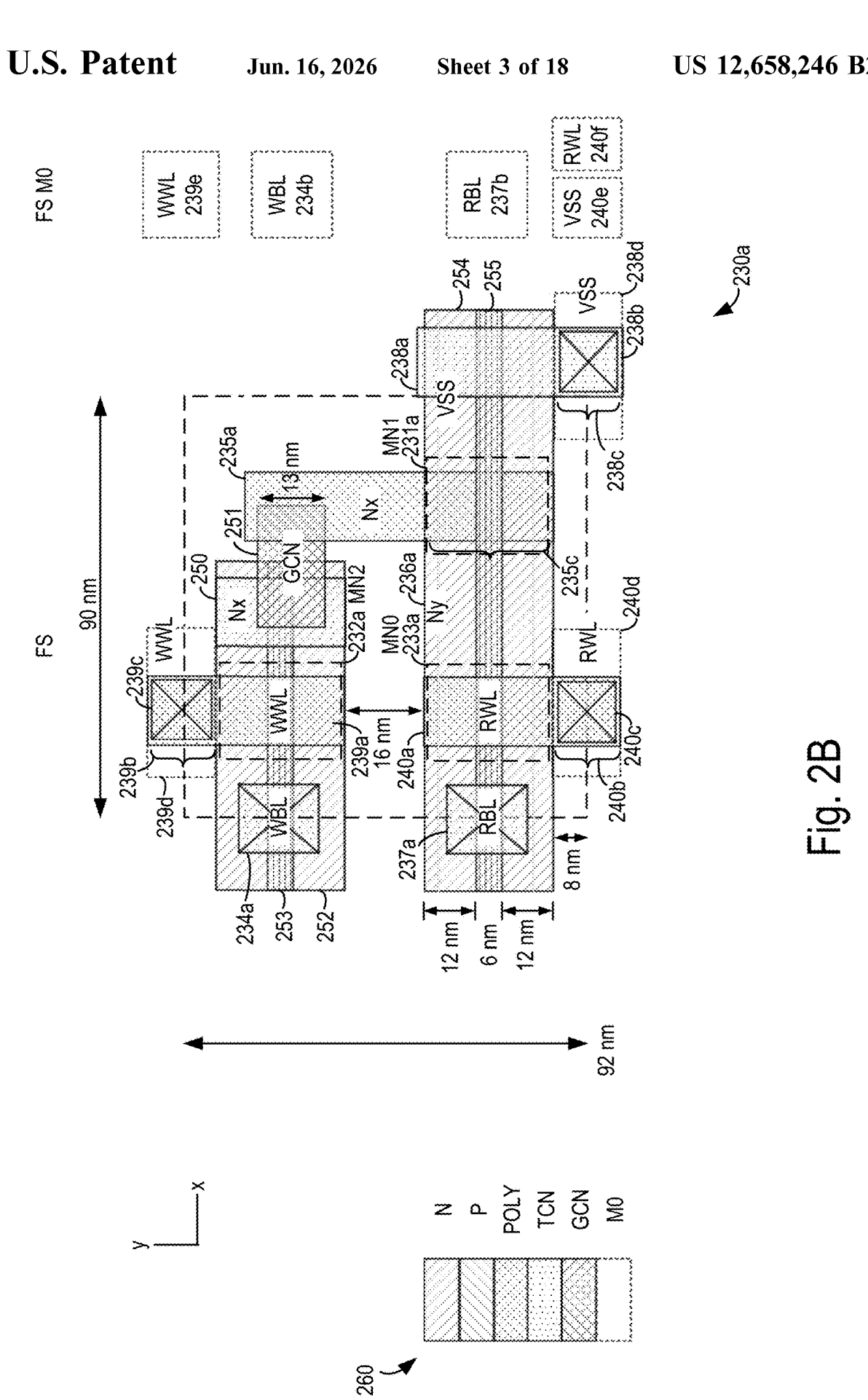
FIG. 2B depicts an example layout 230a of the 3TGC of FIG. 2A, in accordance with various embodiments.

FIG. 2B depicts an example layout 230a of the 3TGC of FIG. 2A, in accordance with various embodiments. In the layouts provided herein, the view is in an x-y plane looking from a top or front side of the cell (a side of the cell facing away from the substrate on which the cell is formed). The bottom or back side of the cell is a side of the cell facing the substrate. Various regions are depicted with patterns. See the key 260. A region with a cross or X generally denotes a via extending in the z direction, either toward or away from the substrate. The regions are depicted with some transparency so that underlying regions remain visible. As depicted in the key, the regions include an n-type diffusion region (N), a p-type diffusion region (P), a polysilicon region (POLY), a trench contact region (TCN), denoting a contact to a source or drain region, a gate contact region (GCN), denoting a contact to a control gate of a transistor, and a metal zero layer (M0), denoting a first metal layer. Regions labelled with VSS receive a voltage such as ground (0 V).

FS denotes the front side or top side of the cell. BS denotes the back side or bottom side of the cell. The cell has a height or length along the y direction. FS M0 denotes a front side M0 layer. BS M0 denotes a back side M0 layer. Successive metal layers above the cell are M0, M1, M2 . . . and successive metal layers below the cell are BM0, BM1, BM2 . . . .

This is a front side view which includes two n-type regions 252 and 254, each of which includes a respective channel 253 and 255 for the conduction of electrons. A transistor 232a, shown by a dashed line rectangle, represents the MN2 transistor. It includes portions of the n-type region 252 as source/drain regions and a WWL region 239a as a control gate. The WWL region extends across the n-type region 252 in the y direction, and includes a portion 239b which extends laterally outside the n-type region. A via 239a extends upward from the portion 239c to a WWL path 239d of the WWL metal layer 239e.

A via 234a is electrically connected to a drain region of MN2 and extends upward to a write bit line (WBL) 234b.

A node Nx 250 extends across the n-type region 252 in the y direction, and is coupled to a node Nx 235a by a GCN 251. Nx in turn is coupled to the n-type region 254, where a transistor 233a, shown by a dashed line rectangle, represents the MN0 transistor, and a transistor 231a, shown by a dashed line rectangle, represents the MN1 transistor. A portion 235c of node Nx 235a forms a control gate of MN1. MN1 includes portions of the n-type region 254 as source/drain regions and Nx as the control gate.

MN0 includes portions of the n-type region 254 as source/drain regions and a RWL region 240a as a control gate. The RWL region 240a extends across the n-type region 254 in the y direction, and includes a portion 240b which extends laterally of the n-type region. A via 240c extends upward from the lateral portion to a RWL path 240d of a RWL metal layer 240f. VSS 240e and RWL 240f are separate metal layers.

A via 237a is electrically connected to a drain region of MN0 and extends upward from the n-type region 254 to a read bit line (RBL) 237b.

A node Ny 236a extends across the n-type region 254 in the y direction, and provides a conductive path between the drain of MN1 and the source of MN0.

A VSS region 238a extends across the n-type region 254 in the y direction and includes a portion 238b which extends laterally of the n-type region. A via 238c extends upward from the lateral portion to a VSS path 238d of the VSS metal layer 240e.

The WWL, RWL, and node Nx, which are gates of transistors, may be made of polysilicon (poly), for instance. The node Ny in the nMOS layer 254 and the node Nx in the nMOS layer 250 are diffusion regions which are not made from polysilicon.

This design has dimensions of 90 nm in the x direction and 92 nm in the y direction. A distance between the n-type regions is 16 nm. The length of the n-type region 254 in the y direction is made up of the channel length of 6 nm, and 12 nm distances on either side of the channel. The distance between the edge of the n-type region 254 and the center of the via 240c is 8 nm. The distances depicted are for an example case.

Figure 3A:
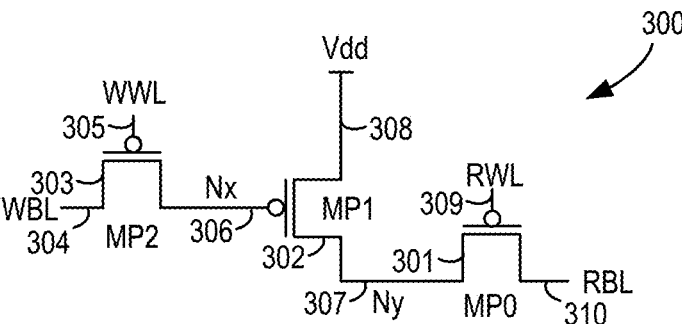
FIG. 3A depicts an example circuit diagram of a comparative 3TGC with three pMOS transistors, in accordance with various embodiments.

FIG. 3A depicts an example circuit diagram of a comparative 3TGC with three pMOS transistors, in accordance with various embodiments. This is an alternate to the all-nMOS design of FIG. 2, and includes three pMOS transistors and no nMOS transistors. Similar to the all-nMOSs design, the layout height for this cell is also restricted to 92 nm with under-utilization here of the nMOS diffusion and front side M0. In summary, the bit-cells in FIG. 2A to 3B do not take advantage of the 3D nature of a CFET device, with nMOS stacked on top of pMOS, since they use either all nMOS or all pMOS devices.

The memory cell 300 includes first, second and third nMOS transistors 301, 302 and 303, respectively, also referred to as MP0, MP1 and MP2, respectively. MP0 and MP1 are used for reading, and MP0 receives a RWL voltage at its control gate 309 and a RBL voltage at its source 310. A drain of MP0 is at a node Ny 307. This is a source voltage of MP1. A voltage of a drain 308 of MP1 is at Vdd, a positive power supply voltage. A control gate of MP1 is a storage node Nx 306. MP2 is used for writing a voltage to Nx based on a WWL voltage at its control gate 305 and a WBL voltage at its source 304. The drain of MP2 is at Nx. As before, the storage node Nx can store a voltage representing a 0 or 1 bit, for example.

Figure 3B:
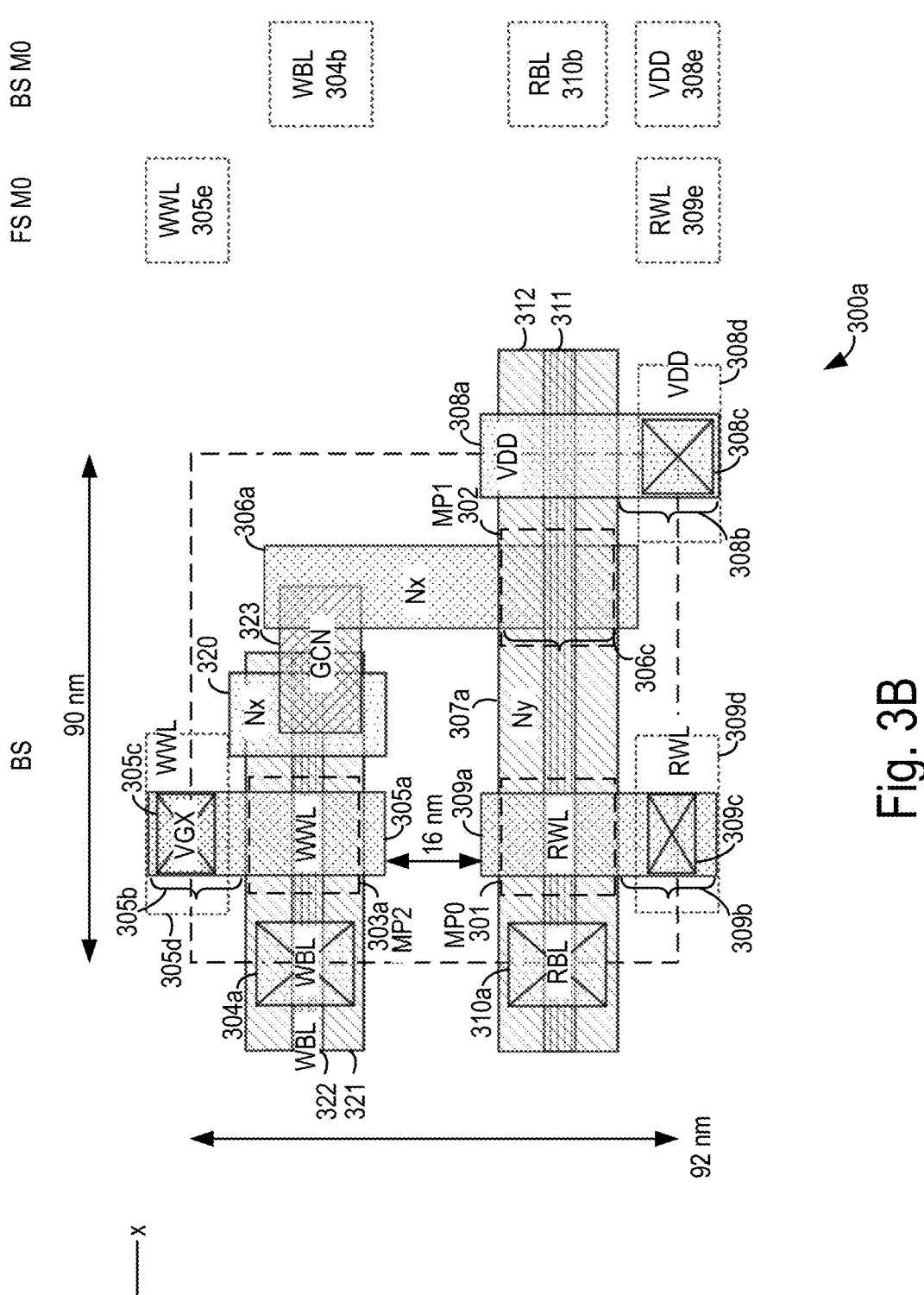
FIG. 3B depicts an example layout 300a of the 3TGC of FIG. 3A, in accordance with various embodiments.

FIG. 3B depicts an example layout 300a of the 3TGC of FIG. 3A, in accordance with various embodiments. This is a back side view which includes two p-type regions 321 and 312, each of which includes a respective channel 322 and 311 for the conduction of holes. A transistor 303a, shown by a dashed line rectangle, represents the MP2 transistor. It includes portions of the p-type region 321 as source/drain regions and a WWL region 305a as a control gate. The WWL region 305a extends across the p-type region 321 in the y direction. A portion 305b of the WWL region extends laterally of the p-type region. A via 305c (VGX) extends upward from the lateral portion to a WWL path 305d of a WWL metal layer 305e.

A via 304a which is coupled to the source of the MP2 transistor extends downward from the diffusion region to a WBL metal layer 304b.

A Nx node 320 extends across the p-type region 321 in the y direction, and is electrically connected to a drain of the MP2 transistor. Nx is coupled to a node Nx 306a by a GCN 323. Nx in turn is coupled to the p-type region 312, where a transistor 301, shown by a dashed line rectangle, represents the MP0 transistor, and a transistor 302, shown by a dashed line rectangle, represents the MP1 transistor. A portion 306c of Nx node 306a forms a control gate of MP1. MP1 includes portions of the p-type region 312 as source/drain regions and Nx as a control gate.

MP0 includes portions of the p-type region 312 as source/drain regions and a RWL region 309a as a control gate. The RWL region 309a extends across the p-type region 312 in the y direction, and includes a portion 309b which extends laterally of the p-type region. A via 309c extends upward from the lateral portion to a RWL path 309d of a RWL metal layer 309e through a VGX via.

A via 310a is electrically connected to a source region of MP0 and extends upward from the p-type region 312 to a RBL 310b.

A node Ny 307a extends across the p-type region 312 in the y direction, and provides a conductive path between the drain of MP0 and the source of MP1. A VDD region 308a includes a portion 308b which extends laterally of the p-type region. A via 308c extends downward from the lateral portion to a VDD path 308d of a VDD metal layer 308e.

This design has dimensions of 90 nm in the x direction and 92 nm in the y direction, as in FIG. 2B. A distance between the WWL region 305b and the RWL region 309a is 16 nm. Similar to FIG. 2B, the length of the p-type region 312 in the y direction is made up of the channel length of 6 nm, and 12 nm distances on either side of the channel. The distance between the edge of the p-type region 312 and the center of the via 309c is 8 nm.

In FIGS. 2B and 3B, the n-type regions and the p-type regions, respectively, are on a common level in the semiconductor device. The diffusion regions may be separated by an isolation region in a substrate, for example.

Figure 4:
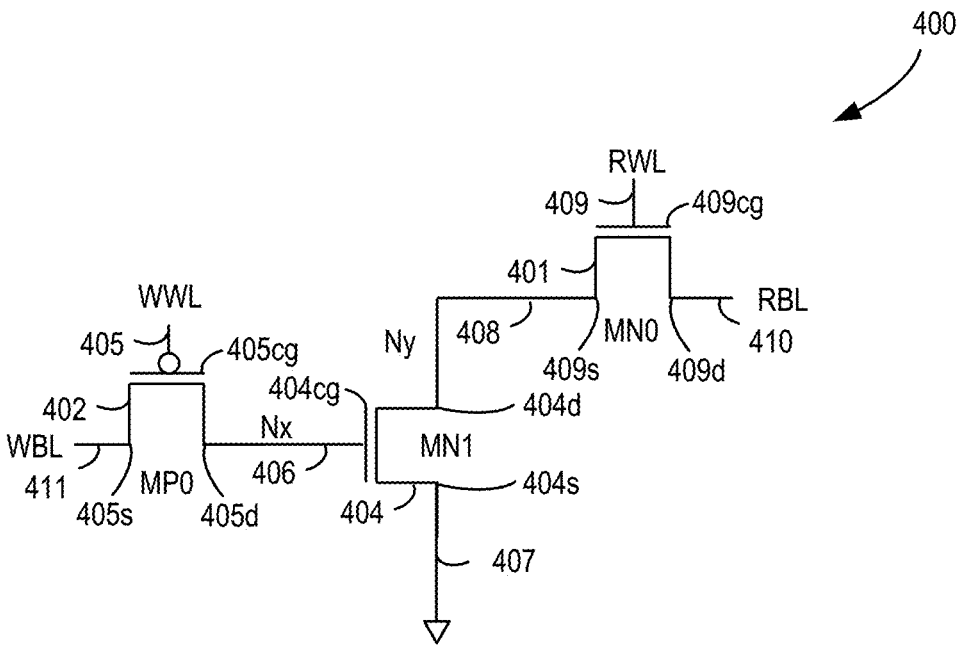
FIG. 4 depicts an example circuit diagram of a space-efficient 3TGC with one pMOS transistor and two nMOS transistors, in accordance with various embodiments.
Figure 5A:
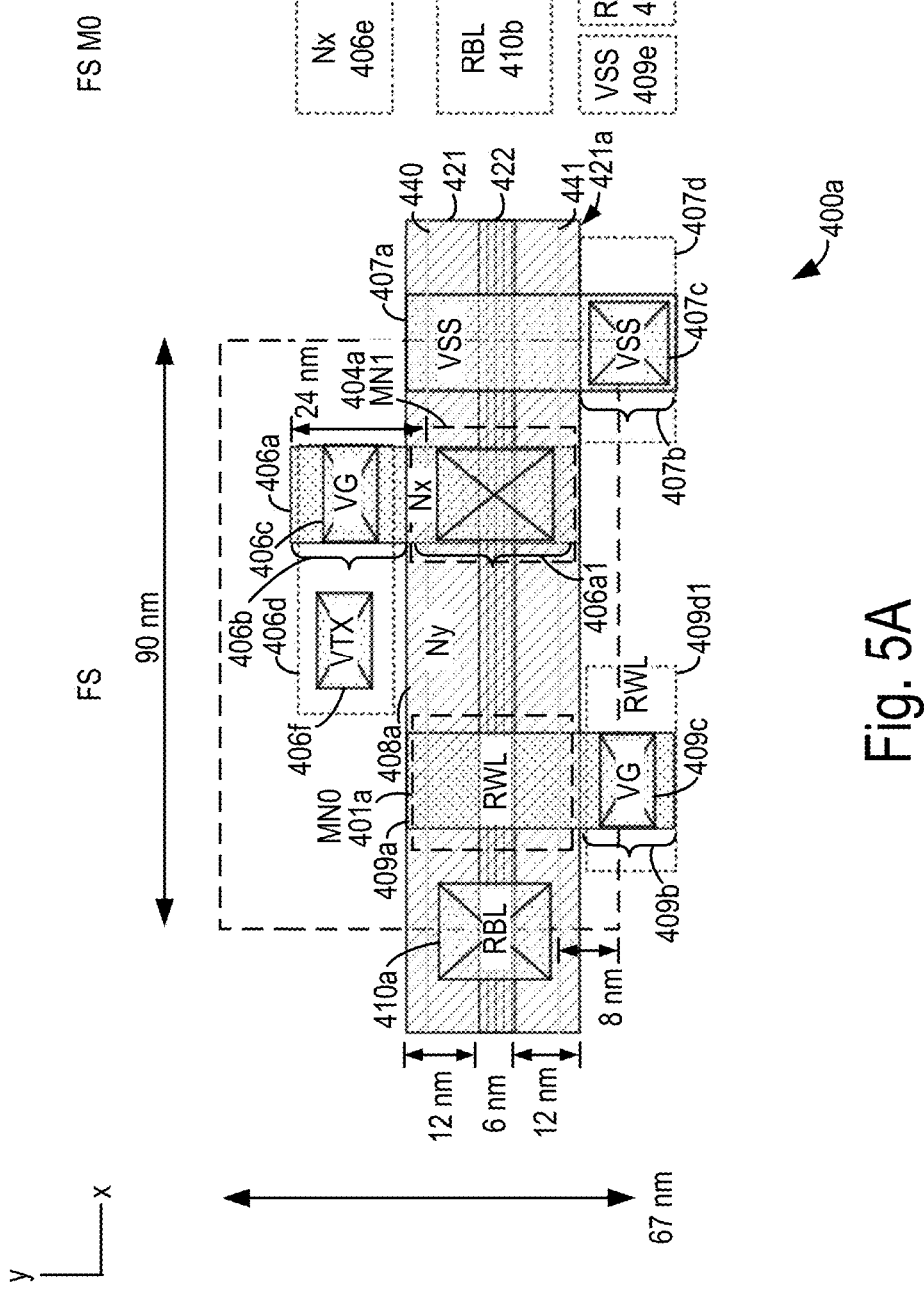
FIG. 5A depicts an example layout 400a of the front side of the 3TGC of FIG. 4, in accordance with various embodiments.
Figure 5B:
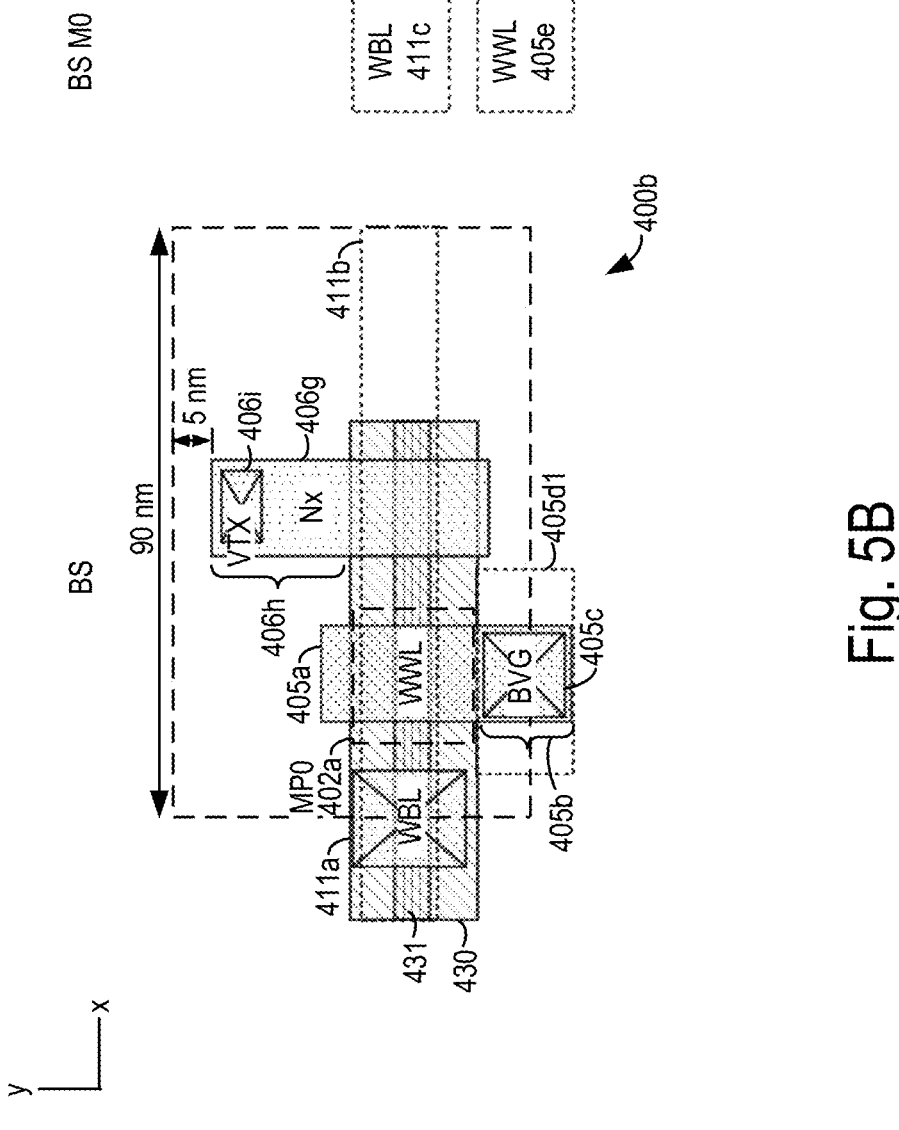
FIG. 5B depicts an example layout 400b of the back side of the 3TGC of FIG. 4, consistent with FIG. 5A, in accordance with various embodiments.

FIG. 4 depicts an example circuit diagram of a 3TGC with one pMOS transistor and two nMOS transistors, in accordance with various embodiments. A first example implementation of the proposed 3TGC is provided with one pMOS transistor 402 and two nMOS transistors 401 and 404. A corresponding efficient layout is presented in FIG. 5. Compared to the all-nMOS and all-pMOS designs of FIGS. 2B and 3B, respectively, the layout height of the proposed cell decreases from 92 nm to 67 nm, resulting in 27% area savings. The savings results from using a pMOS write transistor MP0 (controlled by WWL) instead of an nMOS write transistor as in FIGS. 2A and 2B. Note that MP0 can be located in the proposed 3TGC directly under the nMOS read transistor MN0 (controlled by RWL), in one approach, as shown in FIGS. 5A and 5B. A via 406*c* (VG) is used for connecting the MP0 diffusion (TCN) to the MN1 gate through the node Nx (406*a*). VG is followed by a M0 path 406*d* and then a via 406*f* (VTX). See also FIG. 11A to 11C for definitions of different layout layers available in 3D CFET technology to further understand the layouts provided herein.

The memory cell 400 includes first and second nMOS transistors 401 and 404, respectively, also referred to as MN0 and MN1, respectively, and a pMOS transistor 402, also referred to as MP0. The read path is based on the two nMOS transistors and the write path is based on the one pMOS transistor. MN0 is used for reading and receives a RWL voltage at its control gate 409 and a RBL voltage at its drain 410. A source of MN0 is coupled to a node Ny 408. This is a drain voltage of MN1. A voltage of a source of MN1 on a path 407 is at ground. A control gate of MN1 is coupled to a storage node Nx 406. MP0 is used for writing a 0 or 1 bit to the storage node based on a WWL voltage at its control gate 405 and a WBL voltage at its drain 411. The drain of MP0 is at the node Nx.

The transistor 402 has a control gate 405*cg*, a source 405*s* and a drain 405*d*. The transistor 404 has a control gate 404*cg*, a source 404*s* and a drain 404*d*. The transistor 409 has a control gate 409*cg*, a source 409*s* and a drain 409*d*.

Figure 6A:
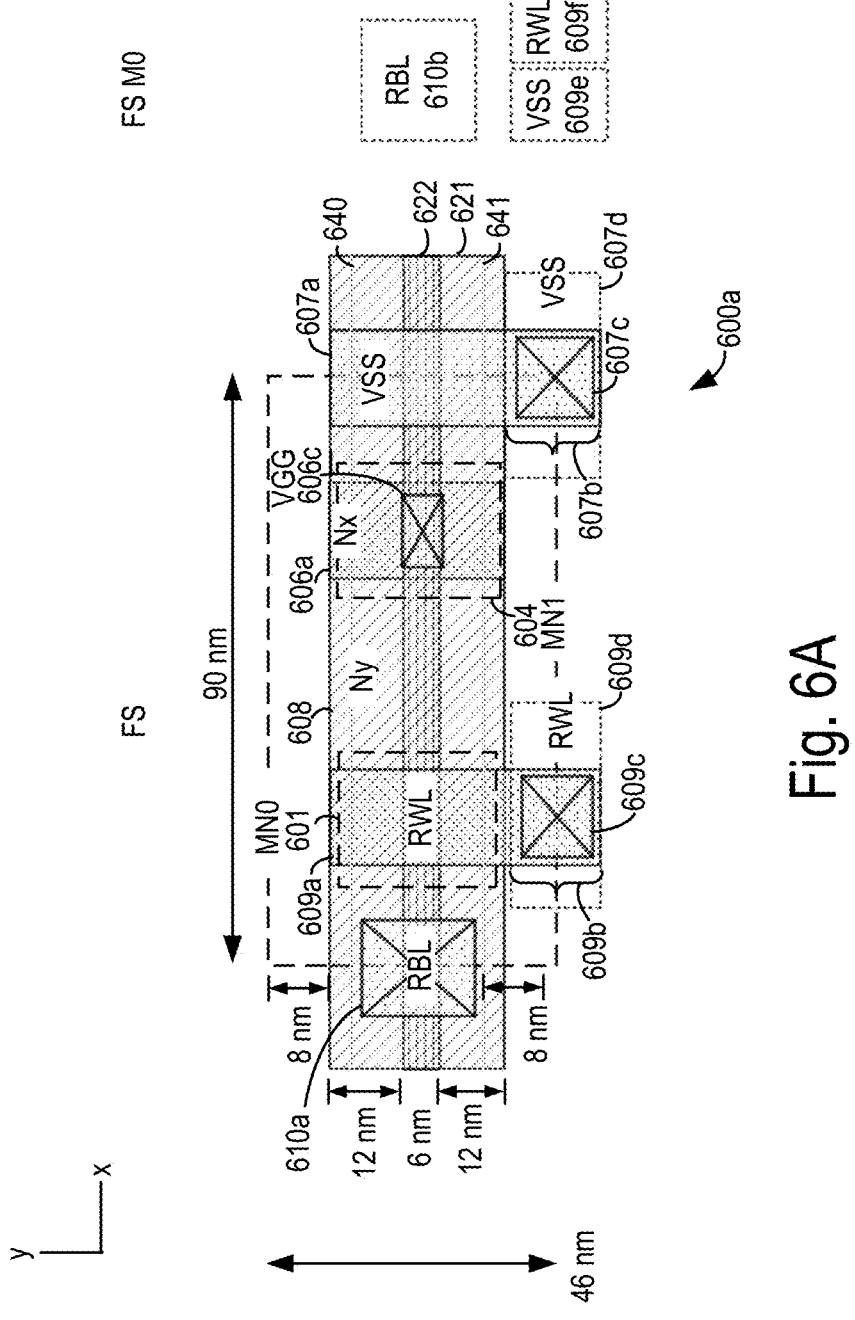
FIG. 6A depicts an example alternative layout 600a of the front side of the 3TGC of FIG. 4, in accordance with various embodiments.
Figure 6B:
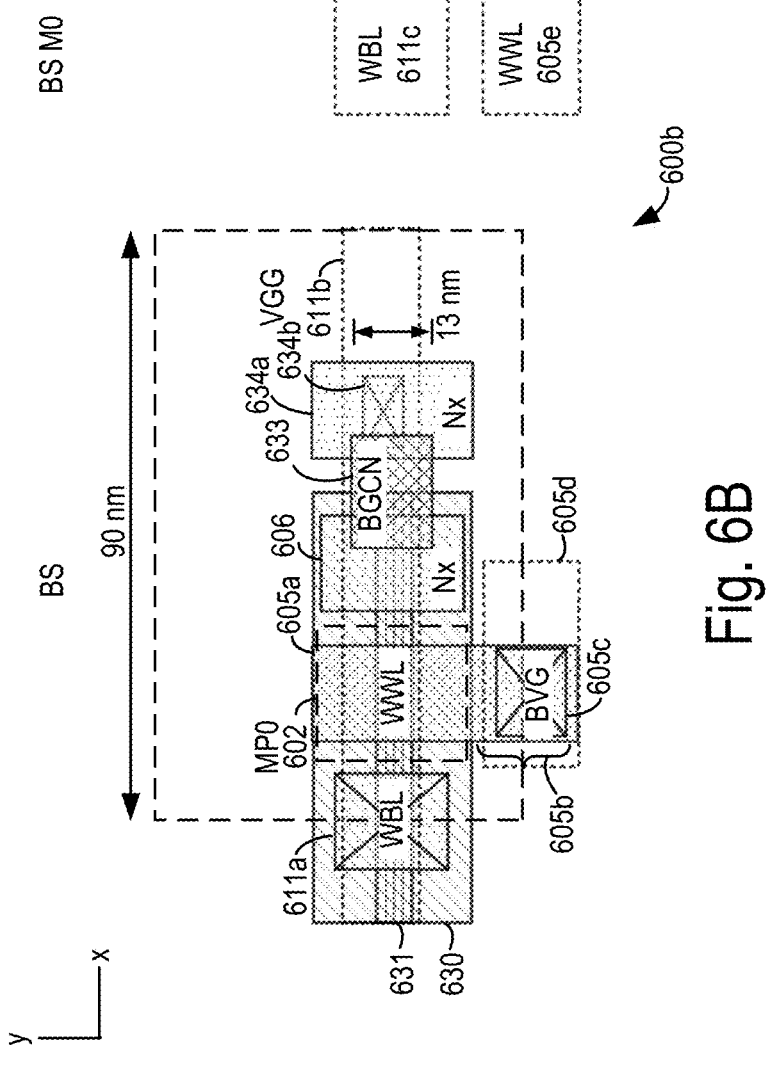
FIG. 6B depicts an example alternative layout 600b of the back side of the 3TGC of FIG. 4, in accordance with various embodiments.

FIG. 5A depicts an example layout 400*a* of the front side of the 3TGC of FIG. 4, in accordance with various embodiments. In the implementation of FIGS. 6A and 6B, a conductive path between the node Nx in the front side and the drain of MP0 in the back side extends laterally of the n-type and p-type regions. An n-type region 421 includes a channel 422 for the conduction of electrons. A transistor 401*a*, shown by a dashed line rectangle, represents the MN0 transistor. It includes portions of the n-type region 421 as source/drain regions and a RWL region 409*a* as a control gate. The RWL region 409*a* extends across the n-type region 421 in the y direction, and includes a portion 409*b* which extends laterally of the n-type region. A via 409*c* (VG) extends upward from the lateral portion to a RWL path 409*d*1 of a RWL metal layer 409*e*.

A via 410*a* which is coupled to the drain of MN0 extends upward from the n-type region to a RBL metal layer 410*b*.

A node Ny 408*a* extends across the n-type region in the y direction, to provide a conductive path from the source of MN0 to the drain of MN1.

A node Nx 406*a* extends across the n-type region in the y direction, and includes a portion 406*b* which extends laterally of the n-type region. A via 406*c* (VG) extends upward from the lateral portion to a path 406*d* of an Nx metal layer 406*e*. Another via 406*f* extends downward from the path 406*d* to the lateral portion 406*h* of the node Nx 406*g* of FIG. 5B, thus providing a conductive path from the node Nx 406*a* to the node Nx 406*g*, which in turn is electrically coupled to the source of MP0.

A transistor 404*a*, shown by a dashed line rectangle, represents the MN1 transistor. MN1 includes portions of the n-type region as source/drain regions and the node Nx 406*a* as a control gate. A portion 406*a*1 of Nx 406*a* forms a control gate of MN1.

A VSS region 407*a* extends across the n-type region in the y direction and includes a portion 407*b* which extends laterally of the n-type region. A via 407*c* (VSS) extends upward from the lateral region to a path 407*d* of the VSS metal layer 409*e*. The VSS and RWL metal layers are separate.

This design has dimensions of 90 nm in the x direction and 67 nm in the y direction. The length of the n-type region in the y direction is made up of the channel length of 6 nm, and 12 nm distances on either side of the channel. The distance between the edge of the n-type region 421 and the center of the via 440*c* is 8 nm.

The lines 440 and 441 represent the footprint of the underlying p-type layer. The footprint of the n-type layer is represented by its boundary 421*a*.

FIG. 5B depicts an example layout 400*b* of the back side of the 3TGC of FIG. 4, consistent with FIG. 5A, in accordance with various embodiments. A p-type region 430 includes a channel 431 for conduction of holes. A transistor 402*a*, shown by a dashed line rectangle, represents the MP0 transistor. It includes portions of the p-type region as source/drain regions and a WWL region 405*a* as a control gate. The WWL region 405*a* extends across the p-type region in the y direction, and includes a portion 405*b* which extends laterally of the p-type region. A via 405*c* (BVG) extends downward from the lateral portion to a path 405*d*1 of a WWL metal layer 405*e*.

A via 411*a* which is coupled to the source of MP0 extends downward from the p-type region to a WBL path 411*b* of a WBL metal layer 411*c*.

A node Nx 406*g* extends across the p-type region in the y direction and includes a portion 406*h* which extends laterally of the p-type region. A via 406*i* (VTX) extends upward from the lateral portion to the path 406*d* of the Nx metal layer 406*e*. The via 406*i* of FIG. 5B is the same as the via 406*f* of FIG. 5A.

This design has dimensions of 90 nm in the x direction. A distance between the edge of the node Nx 406*g* and the boundary of the cell is 5 nm.

In FIGS. 5A and 5B, the n-type region is on one level which is above the level of the p-type region.

FIG. 6A depicts an example alternative layout 600*a* of the front side of the 3TGC of FIG. 4, in accordance with various embodiments. In the implementation of FIGS. 6A and 6B, a conductive path between the node Nx 606*a* in the front side and the drain of MP0 in the back side is contained fully within a footprint of the n-type region. The footprint of the region can represent the boundary of the region in the x-y plane, in one approach. The footprint of one transistor or other region overlaps with the footprint of another transistor or other region when their boundary or extent overlaps in the in the x-y plane.

The cell height can be further reduced by an additional 31% as shown, resulting in a total area saving of 50%, by more efficiently utilizing the pMOS transistor space located underneath the nMOS transistor MN1. The 50% savings is based on a height in the y direction of 46 nm instead of 92 nm. In particular, in an example implementation, the area directly under MN1 device, within a footprint of MN1, is used for an Nx connection through a dummy pMOS poly.

This space can be oxidized and used for connecting the diffusion of the pMOS MP0 (BTCN) to the gate poly (node Nx) of MN1 by first using a back side GCN (BGCN) 633 which is electrically connected to the drain of the MP0 transistor. The BGCN in turn is connected to a dummy Nx layer (e.g., poly) which finally connects to the MN1 poly (node Nx) through a via 634*b* (VGG). The BGCN, dummy poly, and VGG combine to connect the pMOS write device (MP0) to the nMOS storage node device (MN1), resulting in 31% more area savings compared to using VT, M0 (metal layer 0), and VTX as in FIGS. 5A and 5B. Moreover, an efficient connection is enabled since the dummy pMOS poly adds extra capacitance on the cell's storage node Nx, which enhances the retention time of the proposed cell against leakage, especially through MP0.

An n-type region 621 includes a channel 622 for the conduction of electrons. A transistor 601, shown by a dashed line rectangle, represents the MN0 transistor. It includes portions of the n-type region 621 as source/drain regions and a RWL region 609a as a control gate. The RWL region 609a extends across the n-type region 621 in the y direction and includes a portion 609b which extends laterally of the n-type region. A via 609a extends upward from the lateral portion to a path 609d of a RWL metal layer 609f.

A via 610a is coupled to a drain of MN0 and extends upward from the n-type region to a RBL metal layer 610b.

A node Ny 608 extends across the n-type region in the y direction to provide a conductive path between a source of MN0 and a drain of MN1.

A node Nx 606a extends across the n-type region in the y direction and provides a control gate of MN1.

A transistor 604, shown by a dashed line rectangle, represents the MN1 transistor. It includes portions of the n-type region 621 as source/drain regions and the node Nx 606a as a control gate.

A via 606c extends downward from the node Nx 606a to the node Nx 634a of FIG. 6B. The via 634b in FIG. 6B is the same as the via 606c in FIG. 6A. The via 606c provides a short circuit between front-side and back-side polysilicon, e.g., between the Nx node 606a and the Nx node 634a. For example, the front side polysilicon of the nMOS is connected to the back side polysilicon of the pMOS. This back side polysilicon (Nx node 634a) is then connected to the Nx node 606 of the pMOS diffusion through the BGCN 633.

A VSS region 607a extends across the n-type region in the y direction and includes a portion 607b which extends laterally of the n-type region. A via 607c extends upward from the lateral portion to a VSS path 607d of the VSS metal layer 609e.

This design has dimensions of 90 nm in the x direction and 46 nm in the y direction. The length of the n-type region in the y direction is made up of the channel length of 6 nm, and 12 nm distances on either side of the channel. The distance between the line 641 of the n-type region and the center of the via 609c is 8 nm. The lines 640 and 641 represent the footprint of the underlying p-type layer, which is smaller in the y direction than the n-type layer.

FIG. 6B depicts an example alternative layout 600b of the back side of the 3TGC of FIG. 4, consistent with FIG. 6A, in accordance with various embodiments. A p-type region 630 includes a channel 631 for the conduction of holes. A transistor 602a, shown by a dashed line rectangle, represents the MP0 transistor. It includes portions of the p-type region as source/drain regions and a WWL region 605b as a control gate. The WWL region 605b extends across the p-type region in the y direction and includes a portion 605 which extends laterally of the p-type region. A via 605c (BVG) extends downward from the lateral portion to a path 605d of a WWL metal layer 605e.

A via 611a is coupled to a source of MP0 and extends upward from the diffusion region to an overlying write bit line 611b in a WBL metal layer 611c. The overlying write bit line 611b extends in the x direction across, and to the right of, the p-type region 630.

A node Nx 606 extends across the p-type region in the y direction, and is coupled to a poly interconnect (dummy node Nx 634a) via a back side GCN (BGCN) region 633. A via 634b (VGG) extends upward from the poly interconnect to the node Nx 606a of FIG. 6A, which is the control gate of MN1. The poly interconnect is an interconnect between the drain of MP0 and the control gate of MN1. The dummy node Nx 634a is outside the p-type region 630 in a surrounding semiconductor region.

This design has dimensions of 90 nm in the x direction. A height in the y direction of the BGCN is 13 nm.

In FIGS. 6A and 6B, the n-type region is on one level which is above the level of the p-type region.

Figure 7:
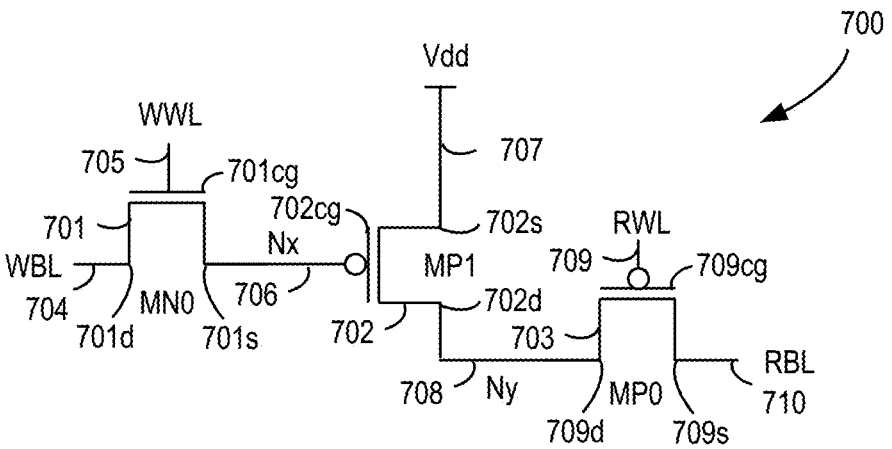
FIG. 7 depicts an example circuit diagram of a space-efficient 3TGC with two pMOS transistors and one nMOS transistor, in accordance with various embodiments.
Figure 8A:
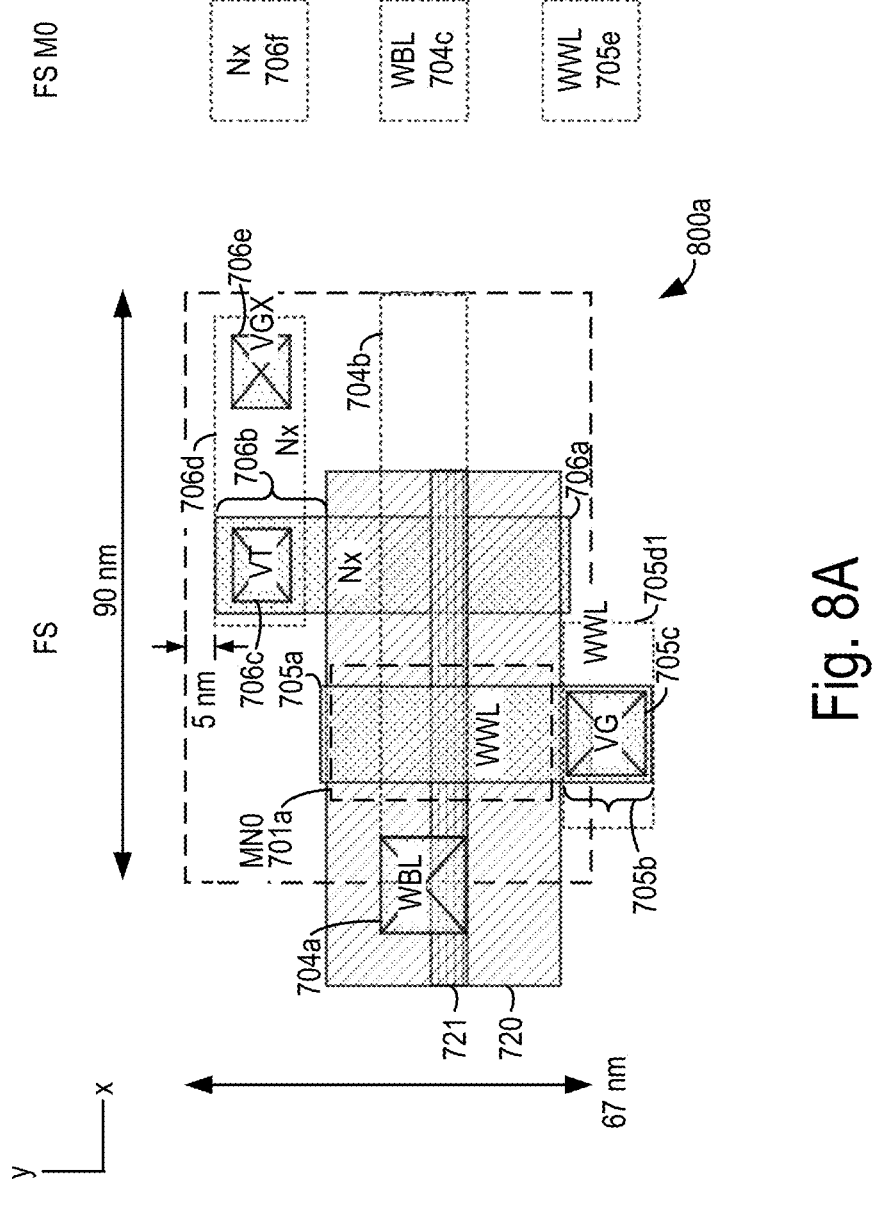
FIG. 8A depicts an example layout 800a of the front side of the 3TGC of FIG. 7, in accordance with various embodiments.
Figure 8B:
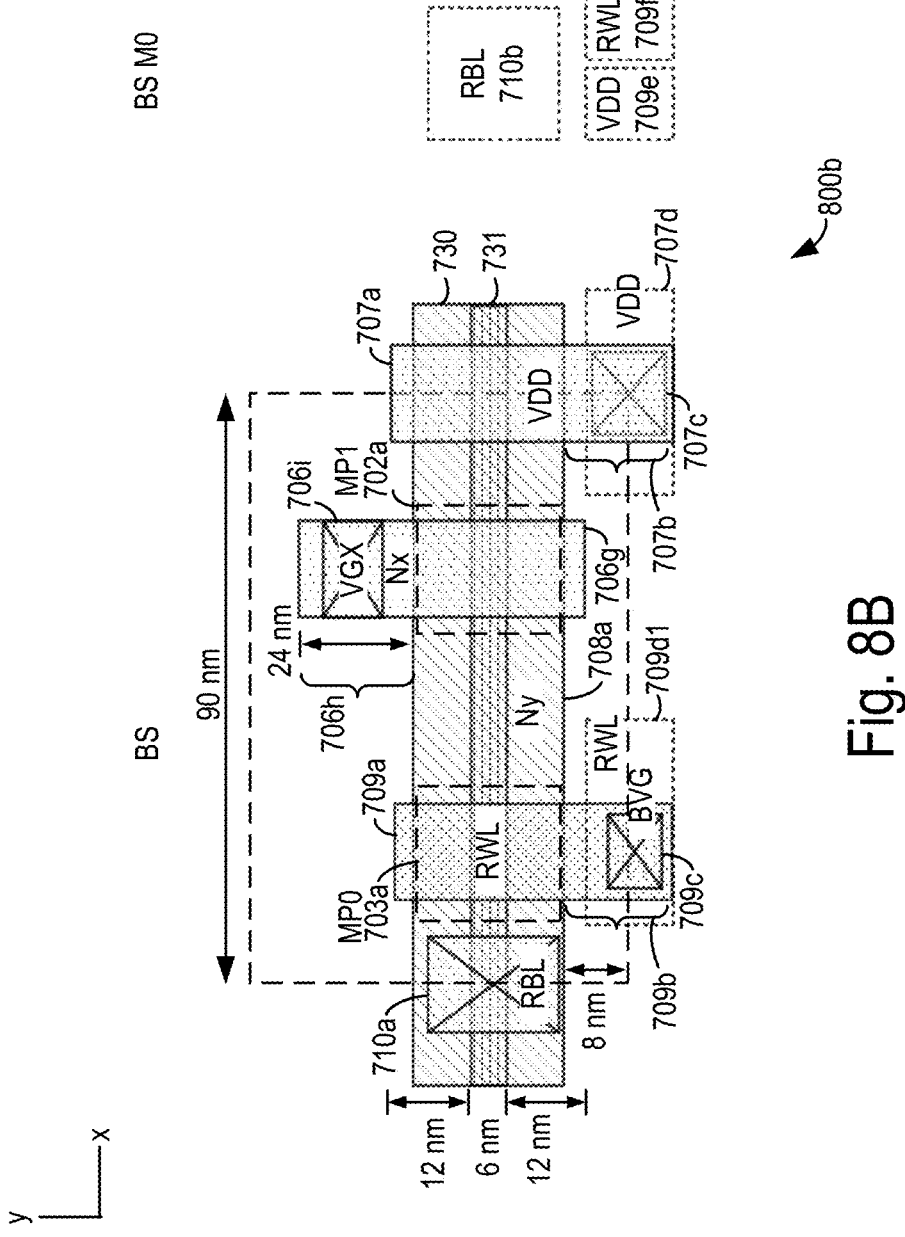
FIG. 8B depicts an example layout 800b of the back side of the 3TGC of FIG. 7, in accordance with various embodiments.

FIG. 7 depicts an example circuit diagram of a 3TGC with two pMOS transistors and one nMOS transistor, in accordance with various embodiments. A complementary 3TGC that is feasible with an nMOS write device (MN0) and a pMOS read port (MP0 and MP1) is depicted. A corresponding layout for this cell, in FIGS. 8A and 8B, provides an area saving of 27% compared to the 3TGC designs in FIG. 2A to 3B (92 nm to 67 nm). In this case, the write transistor MN0 is placed on top of the MP0 pMOS device while the Nx connection between MN0 and MP1 is done using a via 706c (VT), Metal-0 706f, and a via 706e (VGX).

The example cell includes two pMOS transistors and one nMOS transistor. The read path is based on two pMOS transistors (MP0 and MP1) and the write path is based on one nMOS transistor (MN0).

Specifically, the memory cell 700 includes first and second pMOS transistors 703 and 702, respectively, also referred to as MP0 and MP1, respectively, and an nMOS transistor 701, also referred to as MN0. MP0 is used for reading and receives a RWL voltage on a path 709 at its control gate 709cg and a RBL voltage on a path 710 at its source 709s. A drain of MP0 is at a node Ny 708, which holds a drain voltage of MP1. A voltage of a source of MP1 on a path 707 is at Vdd, a positive power supply voltage. A control gate of MP1 is coupled to a node Nx 706 (storage node). A voltage of the node Nx is set by MN0 based on a WWL voltage on a path 705 and a WBL voltage on a path 704. The source of MN0 is coupled to the node Nx 706.

The transistor 701 has a control gate 701cg, a source 701s and a drain 701d. The transistor 702 has a control gate 702cg, a source 702s and a drain 702d. The transistor 709 has a control gate 709cg, a source 709s and a drain 709d.

In FIGS. 7A and 7B, the n-type region is on one level which is above the level of the p-type region.

FIG. 8A depicts an example layout 800a of the front side of the 3TGC of FIG. 7, in accordance with various embodiments. The layout for the proposed 3TGC with two pMOS transistors and one nMOS transistor reduce layout area by 27%.

An n-type region 720 includes a channel 721 for the conduction of electrons. A transistor 701a, shown by a dashed line rectangle, represents the MN0 transistor. It includes portions of the n-type region as source/drain regions and a WWL region 705a as a control gate. The WWL region 705a extends across the n-type region in the y direction and includes a portion 705b which extends laterally of the n-type region. A via 705c (VG) on the lateral portion extends upward to a WWL path 705d1 of a WWL metal layer 705e.

A via 704a is coupled to a drain of MN0 and extends upward from the n-type region to an overlying WBL 704b of a WBL metal layer 704c. The overlying WBL region extends in the x direction across, and to the right of, the n-type region 720.

A node Nx 706a (storage node) extends across the n-type region in the y direction and includes a portion 706b which extends laterally of the n-type region. A via 706c (VT)

extends upward from the lateral portion to an Nx path 706*d* of an Nx metal layer 706*f*. Another via 706*e* (VGX) extends downward from the Nx path 706*d* to the node Nx portion 706*h* in FIG. 8B.

This design has dimensions of 90 nm in the x direction and 67 nm in the y direction. A distance between the edge of the node Nx 706*a* and the boundary of the cell is 5 nm.

FIG. 8B depicts an example layout 800*b* of the back side of the 3TGC of FIG. 7, consistent with FIG. 8A, in accordance with various embodiments. A p-type region 730 includes a channel 731 for the conduction of holes. A transistor 703*a*, shown by a dashed line rectangle, represents the MP0 transistor. It includes portions of the p-type region as source/drain regions and a RWL region 709*a* as a control gate. The RWL region 709*a* extends across the p-type region in the y direction and includes a portion 709*b* which extends laterally of the p-type region. A via 709*c* extends downward from the lateral region to a RWL path 709*d*1 of a RWL metal layer 709*f*.

A via 710*a* is coupled to the source of MP0 and extends upward from the diffusion region to a RBL metal layer 710*b*.

A node Ny 708*a* extends across the p-type region in the y direction to couple the drain of MP0 to the drain of MP1.

A transistor 702*a*, shown by a dashed line rectangle, represents the MP1 transistor. It includes portions of the p-type region as source/drain regions and a node Nx 706*g* as a control gate. The node Nx 706*g* extends across the p-type region in the y direction and includes a portion 706*h* which extends laterally of the p-type region. A via 706*i* (VGX) extends upward from the node Nx to the node Nx 706*a* of FIG. 8. The via 706*i* in FIG. 8B is the same as the via 706*e* in FIG. 8A. The node Nx 706*g* extends past the p-type region by 24 nm, for example, to provide a location for the via 706*i*.

A VDD region 707*a* extends across the p-type region in the y direction and includes a portion 707*b* which extends laterally of the p-type region. A via 707*c* extends downward from the lateral portion to a VDD path 707*d* of the VDD metal layer 709*e*.

In one example, this design has dimensions of 90 nm in the x direction. The length of the p-type region in the y direction is made up of the channel length of 6 nm, and 12 nm distances on either side of the channel.

In FIGS. 8A and 8B, the n-type region is on one level which is above the level of the p-type region.

Figure 9A:
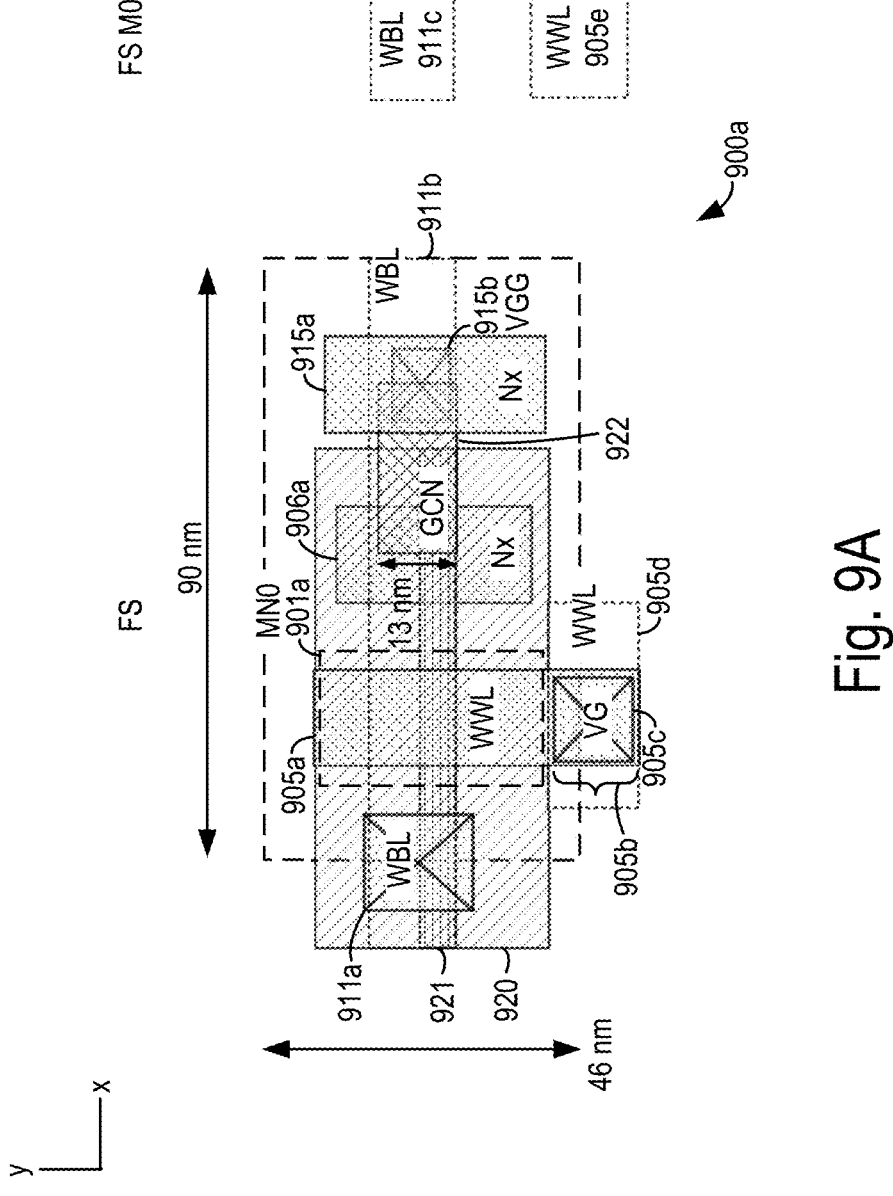
FIG. 9A depicts an example alternative layout 900a of the front side of the 3TGC of FIG. 7, in accordance with various embodiments.

FIG. 9A depicts an example alternative layout 900*a* of the front side of the 3TGC of FIG. 7, in accordance with various embodiments. This alternate layout includes two pMOS transistors and one nMOS transistor and results in an example area scaling of 50% (e.g., from 92 nm to 46 nm in the y direction), when the area above the MP1 pMOS device is used for a Nx connection through a dummy nMOS poly.

Similar to the alternate 3TGC layout in FIGS. 6A and 6B, a further improvement in area is enabled by exploiting the nMOS transistor space above the storage node transistor MP1. This space can be oxidized and used for connecting the diffusion of the nMOS transistor MN0 (TCN) to the gate poly (node Nx) 906*b* of the pMOS transistor MP1 using a GCN contact 922 which in turns connects to a dummy nMOS poly node 915*a*. This dummy node then connects to the MP1 poly (node Nx) 906*b* through a via 915*b* (VGG). As with first implementation, the addition of the nMOS dummy poly above the MP1 device provides both an area benefit and a retention time improvement with added capacitance associated with dummy nMOS poly.

An n-type region 920 includes a channel 921 for the conduction of electrons. A transistor 901*a*, shown by a dashed line rectangle, represents the MN0 transistor. It includes portions of the n-type region as source/drain regions and a WWL region 905*a* as a control gate. The WWL region 905*a* extends across the n-type region in the y direction and includes a portion 905*b* which extends laterally of the n-type region. A via 905*c* (VG) extends upward from the lateral portion to an overlying WWL path 905*d* of a WWL metal layer 905*e*. The WBL path 911*b* extends in the x direction across, and to the right of, the n-type region 920.

A via 911*a* is coupled to a drain of MN0 and extends upward from the n-type region to an overlying WBL path 911*b* of a WBL metal layer 911*c*.

A node Nx 906*a* (storage node) extends across the n-type region in the y direction and is coupled to the source of MN0. A GCN region 922 couples the node Nx 906*a* to a dummy node Nx 915*a*. A via 915*b* (VGG) extends downward from the node Nx 915*a* to the Nx mode 906*b* of FIG. 9B, which is the control gate of MP1. The dummy node Nx 915*a* is outside the n-type region 920 in a surrounding semiconductor region.

In one example, this design has dimensions of 90 nm in the x direction and 46 nm in the y direction.

Figure 9B:
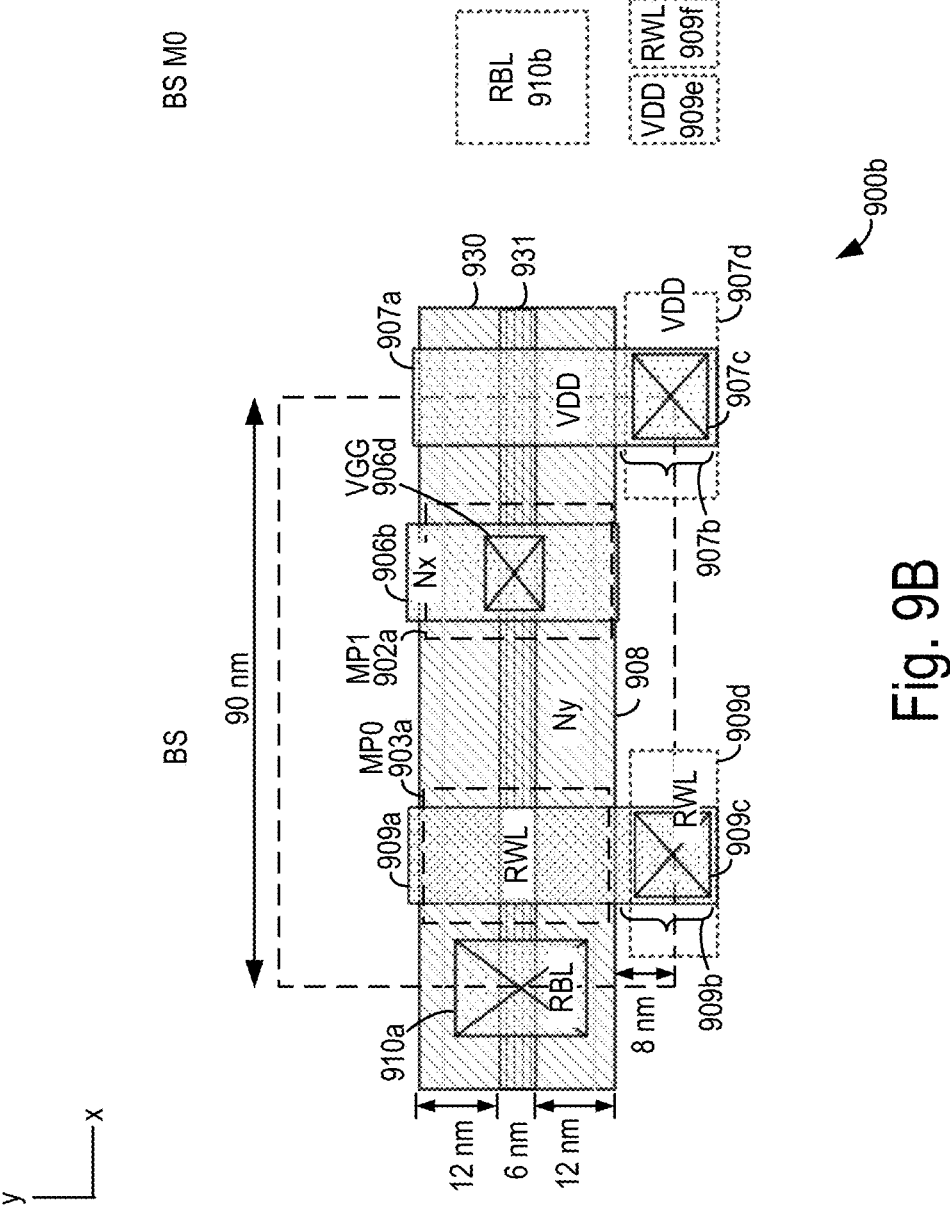
FIG. 9B depicts an example alternative layout 900b of the back side of the 3TGC of FIG. 7, in accordance with various embodiments.

FIG. 9B depicts an example alternative layout 900*b* of the back side of the 3TGC of FIG. 7, consistent with FIG. 9A, in accordance with various embodiments. A p-type region 930 includes a channel 931 for the conduction of holes. A transistor 903*a*, shown by a dashed line rectangle, represents the MP0 transistor. It includes portions of the p-type region as source/drain regions and a RWL region 909*a* as a control gate. The RWL region 909*a* extends across the p-type region in the y direction and includes a portion 909*b* which extends laterally of the n-type region. A via 909*c* extends downward from the lateral portion to a RWL path 909*d* of a RWL metal layer 909*f*.

A transistor 902*a*, shown by a dashed line rectangle, represents the MP1 transistor. It includes portions of the p-type region as source/drain regions and a node Nx 906*b* as a control gate. The node Nx 906*b* extends across the p-type region in the y direction. A via 906*d* (VGG) extends upward from the node Nx 906*b* to the node Nx 915*a* of FIG. 9A, as discussed. Through the via 906*d*, the back side polysilicon (Nx 906*b*) of the pMOS is connected to, and short circuited to, the front side polysilicon (Nx 915*a*) of the nMOS. The front side polysilicon (Nx 915*a*) is connected to the Nx 906*a* of the nMOS diffusion through the GCN 922.

A via 910*a* extends upward from the node Nx 906*b* to a RBL metal layer 910*b*.

A node Ny 908 extends across the p-type region in the y direction and couples the drain of MP0 to the drain of MP1.

A VDD region 907*a* extends across the p-type region in the y direction and includes a portion 907*b* which extends laterally of the p-type region. A via 907*c* extends downward from the lateral portion to a VDD path 907*d* of the VDD metal layer 909*e*.

In one example, this design has dimensions of 90 nm in the x direction. The length of the p-type region in the y direction is made up of the channel length of 6 nm, and 12 nm distances on either side of the channel.

In FIGS. 9A and 9B, the n-type region is on one level which is above the level of the p-type region.

FIG. 10 depicts an example table of control signals for read, wrote and retention operations for the 3TGC of FIG. 4 or 7, in accordance with various embodiments. The control signals apply to both the cell of the first circuit 400 (Cir. 1) of FIG. 4 with one pMOS transistor and two nMOS transistors, and the cell of the second circuit 700 (Cir. 2) of FIG. 7 with two pMOS transistors and one nMOS transistor.

The first column depicts the operation of write 0 (write a 0 bit), write 1 (write a 1 bit), read 1 (read a 1 bit), read 0 (read a 0 bit) or retention. The second column depicts the voltage of the WBL. The next two columns depict the WWL voltage for circuits 1 and 2. The next two columns depict the RBL voltage for circuits 1 and 2. The final two columns depict the RWL voltage for circuits 1 and 2. Vdd denotes a positive power supply voltage.

Figures 11A, 11B, 11C:
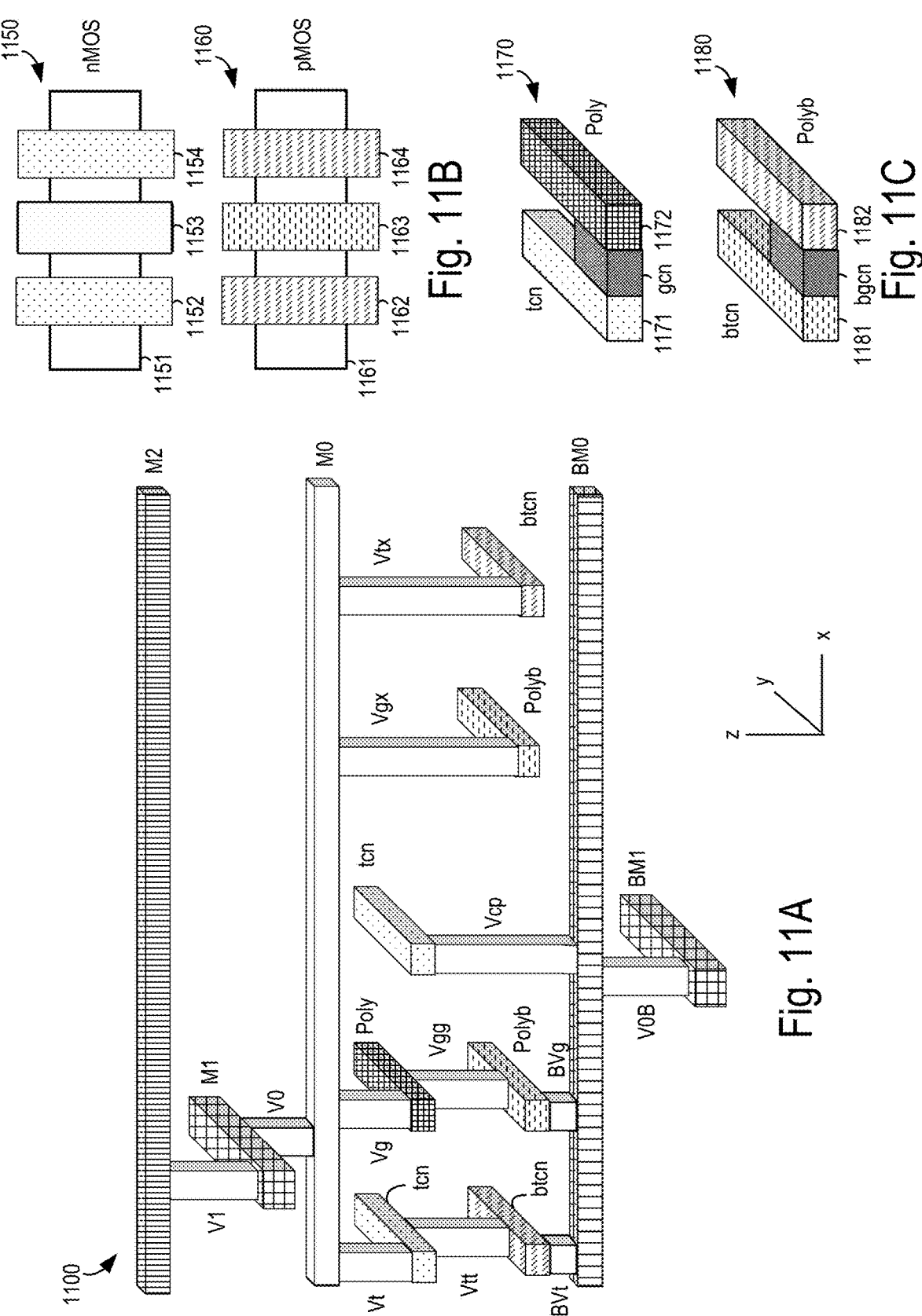
FIG. 11A depicts an example perspective view of different layers and vias that are supported in CFET technology, in accordance with various embodiments.
FIG. 11B depicts an example view of an nMOS transistor 1150 and pMOS transistor 1160 consistent with FIG. 11A, and in accordance with various embodiments.
FIG. 11C depicts an example view of a first structure 1170 and a second structure 1180 consistent with FIG. 11A, and in accordance with various embodiments.

FIG. 11A depicts an example perspective view of different layers and vias that are supported in CFET technology, in accordance with various embodiments. FIG. 11A-11C depict various connections and naming conventions to assist in understanding of the other figures. The structure 1100 includes a bottom metal layer, BM1, as a bottommost or first layer. A bottom metal zero layer, BM0, is a second layer connected to BM1 by a via V0B. A next higher layer includes btcn and Polyb which are connected to the underlying BM0 by vias BVt and BVg, respectively. This layer also includes Polyb and btcn which are connected to an overlaying metal zero layer, M0, by vias Vgx and Vtx, respectively. Use of a shorter via to connect to a metal layer is preferable to reduce capacitance and complexity. The closest metal layer may be below or above in different cases. A next higher layer includes tcn and Poly which are connected to btcn and Polyb by vias Vtt and Vgg, respectively. M0 is the next higher layer. M0 is connected to tcn and Poly by vias Vt and Vg, respectively. A next higher layer above M0 is a metal one layer, M1. M1 is connected to M0 by a via V0. A next higher layer is a metal two layer, M2. M2 is connected to M1 by a via V1.

FIG. 11B depicts an example view of an nMOS transistor 1150 and pMOS transistor 1160 consistent with FIG. 11A, and in accordance with various embodiments. The nMOS includes an active area 1151 with regions 1152-1154 and the pMOS includes an active area 1161 with regions 1162-1164.

FIG. 11C depicts an example view of a first structure 1170 and a second structure 1180 consistent with FIG. 11A, and in accordance with various embodiments. An intermediate structure gcn is used to connect structures 1171 (tcn) and 1172 (poly) which extend horizontally in the x-y plane. Similarly, an intermediate structure bgecn is used to connect structures 1181 (btcn) and 1182 (polyb) which extend horizontally in the x-y plane.

Figure 12:
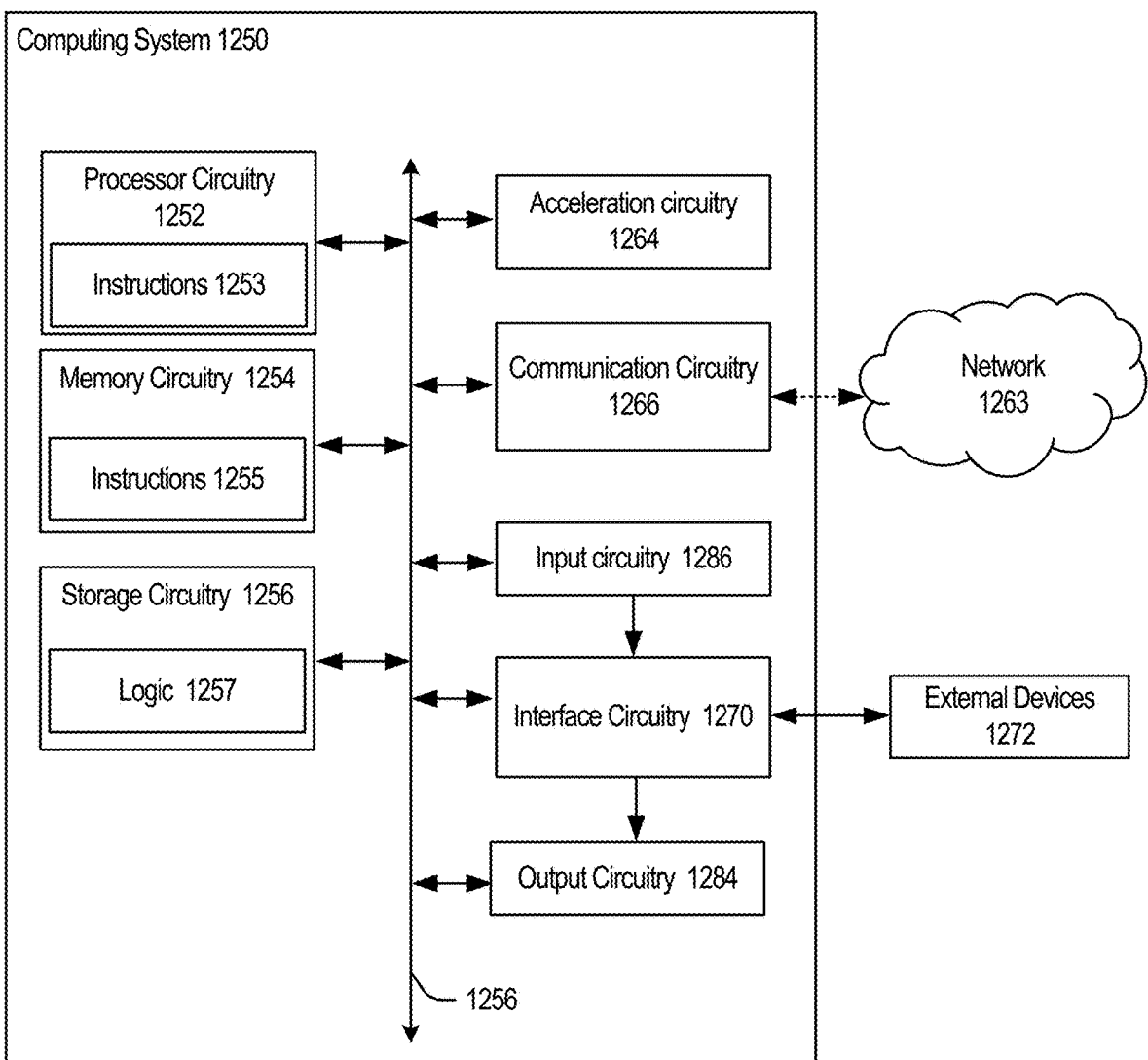
FIG. 12 illustrates an example of components that may be present in a computing system 1250 for implementing the techniques (e.g., operations, processes, methods, and methodologies) described herein.

FIG. 12 illustrates an example of components that may be present in a computing system 1250 for implementing the techniques (e.g., operations, processes, methods, and methodologies) described herein. The CFET memory cell described herein can be included as part of DRAM in the processor circuitry 1252 and memory circuitry 1254, for example.

The computing system 1250 may include any combinations of the hardware or logical components referenced herein. The components may be implemented as ICs, portions thereof, discrete electronic devices, or other modules, instruction sets, programmable logic or algorithms, hardware, hardware accelerators, software, firmware, or a combination thereof adapted in the computing system 1250, or as components otherwise incorporated within a chassis of a larger system. For one embodiment, at least one processor 1252 may be packaged together with computational logic 1257 and configured to practice aspects of various example embodiments described herein to form a System in Package (SiP) or a System on Chip (SoC).

The system 1250 includes processor circuitry in the form of one or more processors 1252. The processor circuitry 1252 includes circuitry such as, but not limited to one or more processor cores and one or more of cache memory, low drop-out voltage regulators (LDOs), interrupt controllers, serial interfaces such as SPI, I2C or universal programmable serial interface circuit, real time clock (RTC), timer-counters including interval and watchdog timers, general purpose I/O, memory card controllers such as secure digital/multi-media card (SD/MMC) or similar, interfaces, mobile industry processor interface (MIPI) interfaces and Joint Test Access Group (JTAG) test access ports. In some implementations, the processor circuitry 1252 may include one or more hardware accelerators (e.g., same or similar to acceleration circuitry 1264), which may be microprocessors, programmable processing devices (e.g., FPGA, ASIC, etc.), or the like. The one or more accelerators may include, for example, computer vision and/or deep learning accelerators. In some implementations, the processor circuitry 1252 may include on-chip memory circuitry, which may include any suitable volatile and/or non-volatile memory, such as DRAM, SRAM, EPROM, EEPROM, Flash memory, solid-state memory, and/or any other type of memory device technology, such as those discussed herein The processor circuitry 1252 may include, for example, one or more processor cores (CPUs), application processors, GPUs, RISC processors, Acorn RISC Machine (ARM) processors, CISC processors, one or more DSPs, one or more FPGAs, one or more PLDs, one or more ASICs, one or more baseband processors, one or more radio-frequency integrated circuits (RFIC), one or more microprocessors or controllers, a multi-core processor, a multithreaded processor, an ultra-low voltage processor, an embedded processor, or any other known processing elements, or any suitable combination thereof. The processors (or cores) 1252 may be coupled with or may include memory/storage and may be configured to execute instructions stored in the memory/storage to enable various applications or operating systems to run on the platform 1250. The processors (or cores) 1252 is configured to operate application software to provide a specific service to a user of the platform 1250. In some embodiments, the processor(s) 1252 may be a special-purpose processor(s)/controller(s) configured (or configurable) to operate according to the various embodiments herein.

As examples, the processor(s) 1252 may include an Intel® Architecture Core™ based processor such as an i3, an i5, an i7, an i9 based processor; an Intel® microcontroller-based processor such as a Quark™, an Atom™, or other MCU-based processor; Pentium® processor(s), Xeon® processor(s), or another such processor available from Intel® Corporation, Santa Clara, California. However, any number other processors may be used, such as one or more of Advanced Micro Devices (AMD) Zen® Architecture such as Ryzen® or EPYC® processor(s), Accelerated Processing Units (APUs), MxGPUs, Epyc® processor(s), or the like; A5-A12 and/or S1-54 processor(s) from Apple® Inc., Snapdragon™ or Centriq™ processor(s) from Qualcomm® Technologies, Inc., Texas Instruments, Inc.® Open Multimedia Applications Platform (OMAP)™ processor(s); a MIPS-based design from MIPS Technologies, Inc. such as MIPS Warrior M-class, Warrior I-class, and Warrior P-class processors; an ARM-based design licensed from ARM Holdings, Ltd., such as the ARM Cortex-A, Cortex-R, and Cortex-M family of processors; the ThunderX2® provided by Cavium™, Inc.; or the like. In some implementations, the processor(s) 1252 may be a part of a system on a chip (SoC), System-in-Package (SiP), a multi-chip package (MCP), and/or the like, in which the processor(s) 1252 and other components are formed into a single integrated circuit, or a single package, such as the Edison™ or Galileo™ SoC boards from Intel® Corporation. Other examples of the processor(s) 1252 are mentioned elsewhere in the present disclosure.

The system 1250 may include or be coupled to acceleration circuitry 1264, which may be embodied by one or more AI/ML accelerators, a neural compute stick, neuromorphic hardware, an FPGA, an arrangement of GPUs, one or more SoCs (including programmable SoCs), one or more CPUs, one or more digital signal processors, dedicated ASICs (including programmable ASICs), PLDs such as complex (CPLDs) or high complexity PLDs (HCPLDs), and/or other forms of specialized processors or circuitry designed to accomplish one or more specialized tasks. These tasks may include AI/ML processing (e.g., including training, inferencing, and classification operations), visual data processing, network data processing, object detection, rule analysis, or the like. In FPGA-based implementations, the acceleration circuitry 1264 may comprise logic blocks or logic fabric and other interconnected resources that may be programmed (configured) to perform various functions, such as the procedures, methods, functions, etc. of the various embodiments discussed herein. In such implementations, the acceleration circuitry 1264 may also include memory cells (e.g., EPROM, EEPROM, flash memory, static memory (e.g., SRAM, anti-fuses, etc.) used to store logic blocks, logic fabric, data, etc. in LUTs and the like.

In some implementations, the processor circuitry 1252 and/or acceleration circuitry 1264 may include hardware elements specifically tailored for machine learning and/or artificial intelligence (AI) functionality. In these implementations, the processor circuitry 1252 and/or acceleration circuitry 1264 may be, or may include, an AI engine chip that can run many different kinds of AI instruction sets once loaded with the appropriate weightings and training code. Additionally or alternatively, the processor circuitry 1252 and/or acceleration circuitry 1264 may be, or may include, AI accelerator(s), which may be one or more of the aforementioned hardware accelerators designed for hardware acceleration of AI applications. As examples, these processor(s) or accelerators may be a cluster of artificial intelligence (AI) GPUs, tensor processing units (TPUs) developed by Google® Inc., Real AI Processors (RAPs™) provided by AlphaICs®, Nervana™ Neural Network Processors (NNPs) provided by Intel® Corp., Intel® Movidius™ Myriad™ X Vision Processing Unit (VPU), NVIDIA® PX™ based GPUs, the NM500 chip provided by General Vision®, Hardware 3 provided by Tesla®, Inc., an Epiphany™ based processor provided by Adapteva®, or the like. In some embodiments, the processor circuitry 1252 and/or acceleration circuitry 1264 and/or hardware accelerator circuitry may be implemented as AI accelerating co-processor(s), such as the Hexagon 685 DSP provided by Qualcomm®, the PowerVR 2NX Neural Net Accelerator (NNA) provided by Imagination Technologies Limited®, the Neural Engine core within the Apple® A11 or A12 Bionic SoC, the Neural Processing Unit (NPU) within the HiSilicon Kirin 970 provided by Huawei®, and/or the like. In some hardware-based implementations, individual subsystems of system 1250 may be operated by the respective AI accelerating co-processor(s), AI GPUs, TPUs, or hardware accelerators (e.g., FPGAs, ASICs, DSPs, SoCs, etc.), etc., that are configured with appropriate logic blocks, bit stream(s), etc. to perform their respective functions.

The system 1250 also includes system memory 1254. Any number of memory devices may be used to provide for a given amount of system memory. As examples, the memory 1254 may be, or include, volatile memory such as random access memory (RAM), static RAM (SRAM), dynamic RAM (DRAM), synchronous DRAM (SDRAM), RAM-BUS® Dynamic Random Access Memory (RDRAM®), and/or any other desired type of volatile memory device. Additionally or alternatively, the memory 1254 may be, or include, non-volatile memory such as read-only memory (ROM), erasable programmable ROM (EPROM), electrically erasable programmable (EEPROM), flash memory, non-volatile RAM, ferroelectric RAM, phase-change memory (PCM), flash memory, and/or any other desired type of non-volatile memory device. Access to the memory 1254 is controlled by a memory controller. The individual memory devices may be of any number of different package types such as single die package (SDP), dual die package (DDP) or quad die package (Q17P). Any number of other memory implementations may be used, such as dual inline memory modules (DIMMs) of different varieties including but not limited to microDIMMs or MiniDIMMs.

Storage circuitry 1256 provides persistent storage of information such as data, applications, operating systems and so forth. In an example, the storage 1256 may be implemented via a solid-state disk drive (SSDD) and/or high-speed electrically erasable memory (commonly referred to as "flash memory"). Other devices that may be used for the storage 1256 include flash memory cards, such as SD cards, microSD cards, XD picture cards, and the like, and USB flash drives. In an example, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor random access memory (FeTRAM), anti-ferroelectric memory, magnetoresistive random access memory (MRAM) memory that incorporates memristor technology, phase change RAM (PRAM), resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a Domain Wall (DW) and Spin Orbit Transfer (SOT) based device, a thyristor based memory device, a hard disk drive (HDD), micro HDD, of a combination thereof, and/or any other memory. The memory circuitry 1254 and/or storage circuitry 1256 may also incorporate three-dimensional (3D) cross-point (XPOINT) memories from Intel® and Micron®.

The memory circuitry 1254 and/or storage circuitry 1256 is/are configured to store computational logic 1257 in the form of software, firmware, microcode, or hardware-level instructions to implement the techniques described herein. The computational logic 1257 may be employed to store working copies and/or permanent copies of programming instructions, or data to create the programming instructions, for the operation of various components of system 1250 (e.g., drivers, libraries, application programming interfaces (APIs), etc.), an operating system of system 1250, one or more applications, and/or for carrying out the embodiments discussed herein. The computational logic 1257 may be stored or loaded into memory circuitry 1254 as instructions 1257, or data to create the instructions 1257, which are then accessed for execution by the processor circuitry 1252 to carry out the functions described herein. The processor circuitry 1252 and/or the acceleration circuitry 1264 accesses the memory circuitry 1254 and/or the storage circuitry 1256 over the interconnect (IX) 1256. The instructions 1257 direct the processor circuitry 1252 to perform a specific sequence or flow of actions, for example, as described with respect to flowchart(s) and block diagram(s) of operations and functionality depicted previously. The various elements may be implemented by assembler instructions supported by processor circuitry 1252 or high-level languages that may be compiled into instructions 1253, or data to create the instructions 1253, to be executed by the processor circuitry 1252. The permanent copy of the programming instructions may be placed into persistent storage devices of storage circuitry 1256 in the factory or in the field through, for example, a distribution medium (not shown), through a communication interface (e.g., from a distribution server (not shown)), over-the-air (OTA), or any combination thereof.

The IX 1256 couples the processor 1252 to communication circuitry 1266 for communications with other devices, such as a remote server (not shown) and the like. The communication circuitry 1266 is a hardware element, or collection of hardware elements, used to communicate over one or more networks 1263 and/or with other devices. In one example, communication circuitry 1266 is, or includes, transceiver circuitry configured to enable wireless communications using any number of frequencies and protocols such as, for example, the Institute of Electrical and Electronics Engineers (IEEE) 802.11 (and/or variants thereof), IEEE 802.23.4, Bluetooth® and/or Bluetooth® low energy (BLE), ZigBee®, LoRaWAN™ (Long Range Wide Area Network), a cellular protocol such as 3GPP LTE and/or Fifth Generation (5G)/New Radio (NR), and/or the like. Additionally or alternatively, communication circuitry 1266 is, or includes, one or more network interface controllers (NICs) to enable wired communication using, for example, an Ethernet connection, Controller Area Network (CAN), Local Interconnect Network (LIN), DeviceNet, ControlNet, Data Highway+, or PROFINET, among many others.

The IX 1256 also couples the processor 1252 to interface circuitry 1270 that is used to connect system 1250 with one or more external devices 1272. The external devices 1272 may include, for example, sensors, actuators, positioning circuitry (e.g., global navigation satellite system (GNSS)/Global Positioning System (GPS) circuitry), client devices, servers, network appliances (e.g., switches, hubs, routers, etc.), integrated photonics devices (e.g., optical neural network (ONN) integrated circuit (IC) and/or the like), and/or other like devices.

In some optional examples, various input/output (I/O) devices may be present within or connected to, the system 1250, which are referred to as input circuitry 1286 and output circuitry 1284 in FIG. 12. The input circuitry 1286 and output circuitry 1284 include one or more user interfaces designed to enable user interaction with the platform 1250 and/or peripheral component interfaces designed to enable peripheral component interaction with the platform 1250. Input circuitry 1286 may include any physical or virtual means for accepting an input including, inter alia, one or more physical or virtual buttons (e.g., a reset button), a physical keyboard, keypad, mouse, touchpad, touchscreen, microphones, scanner, headset, and/or the like. The output circuitry 1284 may be included to show information or otherwise convey information, such as sensor readings, actuator position(s), or other like information. Data and/or graphics may be displayed on one or more user interface components of the output circuitry 1284. Output circuitry 1284 may include any number and/or combinations of audio or visual display, including, inter alia, one or more simple visual outputs/indicators (e.g., binary status indicators (e.g., light emitting diodes (LEDs)) and multi-character visual outputs, or more complex outputs such as display devices or touchscreens (e.g., Liquid Crystal Displays (LCD), LED displays, quantum dot displays, projectors, etc.), with the output of characters, graphics, multimedia objects, and the like being generated or produced from the operation of the platform 1250. The output circuitry 1284 may also include speakers and/or other audio emitting devices, printer(s), and/or the like. Additionally or alternatively, sensor(s) may be used as the input circuitry 1284 (e.g., an image capture device, motion capture device, or the like) and one or more actuators may be used as the output device circuitry 1284 (e.g., an actuator to provide haptic feedback or the like). Peripheral component interfaces may include, but are not limited to, a non-volatile memory port, a USB port, an audio jack, a power supply interface, etc. In some embodiments, a display or console hardware, in the context of the present system, may be used to provide output and receive input of an edge computing system; to manage components or services of an edge computing system; identify a state of an edge computing component or service; or to conduct any other number of management or administration functions or service use cases.

The components of the system 1250 may communicate over the IX 1256. The IX 1256 may include any number of technologies, including ISA, extended ISA, I2C, SPI, point-to-point interfaces, power management bus (PMBus), PCI, PCIe, PCIx, Intel® UPI, Intel® Accelerator Link, Intel® CXL, CAPI, OpenCAPI, Intel® QPI, UPI, Intel® OPA IX, RapidIO™ system IXs, CCIX, Gen-Z Consortium IXs, a HyperTransport interconnect, NVLink provided by NVIDIA®, a Time-Trigger Protocol (TTP) system, a FlexRay system, PROFIBUS, and/or any number of other IX technologies. The IX 1256 may be a proprietary bus, for example, used in a SoC based system.

The number, capability, and/or capacity of the elements of system 1250 may vary, depending on whether computing system 1250 is used as a stationary computing device (e.g., a server computer in a data center, a workstation, a desktop computer, etc.) or a mobile computing device (e.g., a smartphone, tablet computing device, laptop computer, game console, IoT device, etc.). In various implementations, the computing device system 1250 may comprise one or more components of a data center, a desktop computer, a workstation, a laptop, a smartphone, a tablet, a digital camera, a smart appliance, a smart home hub, a network appliance, and/or any other device/system that processes data.

The techniques described herein can be performed partially or wholly by software or other instructions provided in a machine-readable storage medium (e.g., memory). The software is stored as processor-executable instructions (e.g., instructions to implement any other processes discussed herein). Instructions associated with the flowchart (and/or various embodiments) and executed to implement embodiments of the disclosed subject matter may be implemented as part of an operating system or a specific application, component, program, object, module, routine, or other sequence of instructions or organization of sequences of instructions.

The storage medium can be a tangible machine readable medium such as read only memory (ROM), random access memory (RAM), flash memory devices, floppy and other removable disks, magnetic storage media, optical storage media (e.g., Compact Disk Read-Only Memory (CD ROMS), Digital Versatile Disks (DVDs)), among others.

The storage medium may be included, e.g., in a communication device, a computing device, a network device, a personal digital assistant, a manufacturing tool, a mobile communication device, a cellular phone, a notebook computer, a tablet, a game console, a set top box, an embedded system, a TV (television), or a personal desktop computer.

Some non-limiting examples of various embodiments are presented below.

Example 1 includes an apparatus, comprising: a front side comprising a first n-type metal oxide semiconductor (nMOS) transistor in series with a second nMOS transistor, wherein a drain of the first nMOS transistor is coupled to a read bit line; a back side below the front side, the back side comprising a p-type metal oxide semiconductor (pMOS) transistor and a storage node coupled to a drain of the pMOS transistor, wherein a control gate of the pMOS transistor is coupled to a write word line and a source of the pMOS transistor is coupled to a write bit line; and a conductive path from a control gate of the second nMOS transistor in the front side to the storage node in the back side.

Example 2 includes Example 1, wherein a source of the first nMOS transistor is coupled to a drain of the second nMOS transistor, and a source of the second nMOS transistor is coupled to ground.

Example 3 includes Example 1 or 2, wherein: the front side comprises an n-type region; a portion of the control gate of the second nMOS transistor (MN1) extends laterally of the n-type region; the back side comprises a p-type region; a portion of the storage node of the back side extends laterally of the p-type region; a metal layer is above the front side; and the conductive path comprises a via which extends upward from the portion of the control gate of the second nMOS transistor which extends laterally of the n-type region to the metal layer, and via which extends downward from the metal layer to the portion of the storage node of the back side which extends laterally of the p-type region.

Example 4 includes any one of Examples 1-3, wherein the apparatus comprises a three-transistor gain cell and the pMOS transistor is directly underneath the second nMOS transistor consistent with complementary field effect transistor technology.

Example 5 includes any one of Examples 1-4, wherein: the front side comprises an n-type region; the back side comprises a p-type region; and the conductive path comprises a via which extends within a footprint of the n-type region to provide the conductive path from the control gate of the second nMOS transistor to the storage node.

Example 6 includes Example 5, wherein the back side comprises a dummy polysilicon layer coupled to the storage node, and the conductive path comprises a via which extends vertically downward from the control gate of the second nMOS transistor to the dummy polysilicon layer.

Example 7 includes Example 6, wherein the dummy polysilicon layer is directly underneath the second nMOS transistor.

Example 8 includes Example 6, wherein the dummy polysilicon layer is coupled to the storage node by a back side gate connection.

Example 9 includes any one of Examples 6-8, wherein the dummy polysilicon layer adds a capacitance to a capacitance of the storage node to increase a retention time of the storage node.

Example 10 includes an apparatus, comprising: a first level comprising an n-type metal oxide semiconductor (nMOS) transistor and a storage node coupled to a source of the nMOS transistor; a second level below the first level, the second level comprising a first p-type metal oxide semiconductor (pMOS) transistor, and a second pMOS transistor in series with the first pMOS transistor; and a conductive path from the storage node in the first level to a control gate of the second pMOS transistor in the second level.

Example 11 includes Example 10, wherein: a drain of the nMOS transistor is coupled to a write bit line; a control gate of the nMOS transistor is coupled to a write word line; a source of the first pMOS transistor is coupled to a read bit line; and a control gate of the first pMOS transistor is coupled to a read word line.

Example 12 includes Example 10 or 11, wherein a drain of the first pMOS transistor is coupled to a drain of the second pMOS transistor, and a source of the second pMOS transistor is coupled to a power supply voltage.

Example 13 includes any one of Examples 10-12, wherein: the first level comprises an n-type region; a portion of the storage node of the first level extends laterally of the n-type region; the second level comprises a p-type region; a portion of the control gate of the second pMOS extends laterally of the p-type region; a metal layer is above the first level; and the conductive path comprises a via which extends upward from the portion of the storage node of the first level which extends laterally of the n-type region to the metal layer, and a via which extends downward from the metal layer to the portion of the control gate of the second pMOS which extends laterally of the p-type region.

Example 14 includes any one of Examples 10-13, wherein the apparatus comprises a three-transistor gain cell and the first pMOS transistor is directly underneath the nMOS transistor consistent with complementary field effect transistor technology.

Example 15 includes any one of Examples 10-14, wherein: the first level comprises an n-type region; the second level comprises a p-type region; and the conductive path comprises a via which extends within a footprint of the n-type region to provide the conductive path from the storage node to the control gate of the second pMOS transistor.

Example 16 includes Example 15, wherein the first level comprises a dummy polysilicon layer coupled to the storage node, and the conductive path comprises a via which extends vertically upward from the control gate of the second pMOS transistor to the dummy polysilicon layer.

Example 17 includes a three-transistor gain cell, comprising: an n-type diffusion region arranged above a p-type diffusion region; a first n-type metal oxide semiconductor (nMOS) transistor and a second nMOS transistor in the n-type diffusion region; a p-type metal oxide semiconductor (pMOS) transistor in the p-type diffusion region directly underneath the second nMOS transistor; a storage node coupled to a drain of the pMOS transistor; and a conductive path from a control gate of the second nMOS transistor to the storage node.

Example 18 includes the three-transistor gain cell of Example 17, wherein the conductive path extends downward from the control gate to a dummy node which is coupled to the storage node.

Example 19 includes the three-transistor gain cell of Example 18, wherein the dummy node is coupled to the storage node by a back side gate connection.

Example 20 includes the three-transistor gain cell of any one of Examples 17-19, wherein the conductive path extends upward from the control gate to a metal layer and downward from the metal layer to the storage node.

Example 21 includes a three-transistor gain cell, comprising: an n-type diffusion region arranged above a p-type diffusion region; an n-type metal oxide semiconductor (nMOS) transistor and a storage node coupled to a source of the nMOS transistor in the n-type diffusion region; first and second p-type metal oxide semiconductor (pMOS) transistors in the p-type diffusion region; and a conductive path from the storage node to a control gate of the second pMOS transistor.

Example 22 includes the three-transistor gain cell of Example 21, wherein the conductive path comprises a via which extends upward from the storage node to a metal layer, and a via which extends downward from the metal layer to the control gate of the second pMOS.

Example 23 includes the three-transistor gain cell of Example 21 or 22, wherein the conductive path comprises a dummy node which is coupled to the storage node by a back side gate connection, and a via which extends downward from the dummy node to the control gate of the second pMOS transistor.

In the present detailed description, reference is made to the accompanying drawings that form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, the phrases "A and/or B" and "A or B" mean (A), (B), or (A and B). For the purposes of the present disclosure, the phrase "A, B, and/or C" means (A), (B), (C), (A and B), (A and C), (B and C), or (A, B, and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group), a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

The terms "coupled," "communicatively coupled," along with derivatives thereof are used herein. The term "coupled"

may mean two or more elements are in direct physical or electrical contact with one another, may mean that two or more elements indirectly contact each other but still cooperate or interact with each other, and/or may mean that one or more other elements are coupled or connected between the elements that are said to be coupled with each other. The term "directly coupled" may mean that two or more elements are in direct contact with one another. The term "communicatively coupled" may mean that two or more elements may be in contact with one another by a means of communication including through a wire or other interconnect connection, through a wireless communication channel or link, and/or the like.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus, comprising:
a front side comprising a first n-type metal oxide semi-conductor (nMOS) transistor in series with a second nMOS transistor, wherein a drain of the first nMOS transistor is coupled to a read bit line;
a back side below the front side, the back side comprising a p-type metal oxide semiconductor (pMOS) transistor and a storage node coupled to a drain of the pMOS transistor, wherein a control gate of the pMOS transistor is coupled to a write word line and a source of the pMOS transistor is coupled to a write bit line; and
a conductive path from a control gate of the second nMOS transistor in the front side to the storage node in the back side.

2. The apparatus of claim 1, wherein a source of the first nMOS transistor is coupled to a drain of the second nMOS transistor, and a source of the second nMOS transistor is coupled to ground.

3. The apparatus of claim 1, wherein:
the front side comprises an n-type region;
a portion of the control gate of the second nMOS transistor (MN1) extends laterally of the n-type region;
the back side comprises a p-type region;
a portion of the storage node of the back side extends laterally of the p-type region;
a metal layer is above the front side; and
the conductive path comprises a via which extends upward from the portion of the control gate of the second nMOS transistor which extends laterally of the n-type region to the metal layer, and via which extends downward from the metal layer to the portion of the storage node of the back side which extends laterally of the p-type region.

4. The apparatus of claim 1, wherein the apparatus comprises a three-transistor gain cell and the pMOS transistor is directly underneath the second nMOS transistor consistent with complementary field effect transistor technology.

5. The apparatus of claim 1, wherein:
the front side comprises an n-type region;
the back side comprises a p-type region; and
the conductive path comprises a via which extends within a footprint of the n-type region to provide the conductive path from the control gate of the second nMOS transistor to the storage node.

6. The apparatus of claim 5, wherein the back side comprises a dummy polysilicon layer coupled to the storage node, and the conductive path comprises a via which extends vertically downward from the control gate of the second nMOS transistor to the dummy polysilicon layer.

7. The apparatus of claim 6, wherein the dummy poly-silicon layer is directly underneath the second nMOS transistor.

8. The apparatus of claim 6, wherein the dummy poly-silicon layer is coupled to the storage node by a back side gate connection.

9. The apparatus of claim 6, wherein the dummy poly-silicon layer adds a capacitance to a capacitance of the storage node to increase a retention time of the storage node.

10. An apparatus, comprising:
a first level comprising an n-type metal oxide semicon-ductor (nMOS) transistor and a storage node coupled to a source of the nMOS transistor;

a second level below the first level, the second level comprising a first p-type metal oxide semiconductor (pMOS) transistor, and a second pMOS transistor in series with the first pMOS transistor; and
a conductive path from the storage node in the first level to a control gate of the second pMOS transistor in the second level.

11. The apparatus of claim 10, wherein:
a drain of the nMOS transistor is coupled to a write bit line;
a control gate of the nMOS transistor is coupled to a write word line;
a source of the first pMOS transistor is coupled to a read bit line; and
a control gate of the first pMOS transistor is coupled to a read word line.

12. The apparatus of claim 10, wherein a drain of the first pMOS transistor is coupled to a drain of the second pMOS transistor, and a source of the second pMOS transistor is coupled to a power supply voltage.

13. The apparatus of claim 10, wherein:
the first level comprises an n-type region;
a portion of the storage node of the first level extends laterally of the n-type region;
the second level comprises a p-type region;
a portion of the control gate of the second pMOS extends laterally of the p-type region;
a metal layer is above the first level; and
the conductive path comprises a via which extends upward from the portion of the storage node of the first level which extends laterally of the n-type region to the metal layer, and a via which extends downward from the metal layer to the portion of the control gate of the second pMOS which extends laterally of the p-type region.

14. The apparatus of claim 10, wherein the apparatus comprises a three-transistor gain cell and the first pMOS transistor is directly underneath the nMOS transistor con-sistent with complementary field effect transistor technol-ogy.

15. The apparatus of claim 10, wherein:
the first level comprises an n-type region;
the second level comprises a p-type region; and
the conductive path comprises a via which extends within a footprint of the n-type region to provide the conduc-tive path from the storage node to the control gate of the second pMOS transistor.

16. The apparatus of claim 15, wherein the first level comprises a dummy polysilicon layer coupled to the storage node, and the conductive path comprises a via which extends vertically upward from the control gate of the second pMOS transistor to the dummy polysilicon layer.

17. A three-transistor gain cell, comprising:
an n-type diffusion region arranged above a p-type diffu-sion region;
a first n-type metal oxide semiconductor (nMOS) transis-tor and a second nMOS transistor in the n-type diffu-sion region;
a p-type metal oxide semiconductor (pMOS) transistor in the p-type diffusion region directly underneath the second nMOS transistor;
a storage node coupled to a drain of the pMOS transistor; and
a conductive path from a control gate of the second nMOS transistor to the storage node.

18. The three-transistor gain cell of claim 17, wherein the conductive path extends downward from the control gate to a dummy node which is coupled to the storage node.

19. The three-transistor gain cell of claim 18, wherein the dummy node is coupled to the storage node by a back side gate connection.

20. The three-transistor gain cell of claim 17, wherein the conductive path extends upward from the control gate to a metal layer and downward from the metal layer to the storage node.

21. A three-transistor gain cell, comprising:

an n-type diffusion region arranged above a p-type diffusion region;

an n-type metal oxide semiconductor (nMOS) transistor and a storage node coupled to a source of the nMOS transistor in the n-type diffusion region;

first and second p-type metal oxide semiconductor (pMOS) transistors in the p-type diffusion region; and a conductive path from the storage node to a control gate of the second pMOS transistor.

22. The three-transistor gain cell of claim 21, wherein the conductive path comprises a via which extends upward from the storage node to a metal layer, and a via which extends downward from the metal layer to the control gate of the second pMOS.

23. The three-transistor gain cell of claim 21, wherein the conductive path comprises a dummy node which is coupled to the storage node by a back side gate connection, and a via which extends downward from the dummy node to the control gate of the second pMOS transistor.

\* \* \* \* \*